United States Patent
Yun

(10) Patent No.: US 11,341,078 B2
(45) Date of Patent: May 24, 2022

(54) SSD MULTIPLER WITH VIBRATION RESISTANCE AND STRUCTURE FOR STACKING SSD MEMORY CARDS OF VARIOUS SIZES IN HORIZONTAL SLIDING MANNER

(71) Applicant: STORAGEAN, INC., Seongnam-si (KR)

(72) Inventor: Dong Goo Yun, Seoul (KR)

(73) Assignee: STORAGEAN, INC., Seongnam-si (KR)

( * ) Notice: Subject to any disclaimer, the term of this patent is extended or adjusted under 35 U.S.C. 154(b) by 2 days.

(21) Appl. No.: 16/972,289

(22) PCT Filed: Jun. 5, 2019

(86) PCT No.: PCT/KR2019/006772
§ 371 (c)(1),
(2) Date: Dec. 4, 2020

(87) PCT Pub. No.: WO2019/235834
PCT Pub. Date: Dec. 12, 2019

(65) Prior Publication Data
US 2021/0117364 A1 Apr. 22, 2021

(30) Foreign Application Priority Data
Jun. 5, 2018 (KR) .................... 10-2018-0064986

(51) Int. Cl.
*G06F 13/42* (2006.01)
*G06F 13/16* (2006.01)
(Continued)

(52) U.S. Cl.
CPC ...... *G06F 13/4282* (2013.01); *G06F 13/1668* (2013.01); *H01R 12/73* (2013.01);
(Continued)

(58) Field of Classification Search
None
See application file for complete search history.

(56) References Cited

U.S. PATENT DOCUMENTS 9,904,336 B1 * 2/2018 Khan .................... H05K 7/1401
10,261,554 B1 * 4/2019 Lin ......................... G06F 1/181
(Continued)

FOREIGN PATENT DOCUMENTS

| KR | 20140110004 | 9/2014 |
| KR | 20140145216 | 12/2014 |

(Continued)

OTHER PUBLICATIONS

International Search Report—PCT/KR2019/006772 dated Sep. 19, 2019.
(Continued)

*Primary Examiner* — Henry Tsai
*Assistant Examiner* — Christopher A Bartels
(74) *Attorney, Agent, or Firm* — Cantor Colburn LLP

(57) ABSTRACT

Provided is a high-capacity SSD that has the same form factor as 3.5-inch hard disk drives and has a structure where memory cards, such as standard M.2 SSDs, M.3 SSDs or nonstandard full-scale SSDs, are inserted in a horizontal sliding manner into an exterior having the same size as a 3.5-inch hard disk drive, and are provided in a multi-stage arrangement in the vertical direction. The SSD multiplier
(Continued)

provides a high-capacity SSD case structure having a novel structure where a vertical backplane board is placed at a fixed position such that the case does not need to be disassembled even when an SSD memory card is replaced with another SSD memory card having a different length. Further provided is a case structure which can handle the various sizes of SSD memory cards that are used, where individual SSD memory cards have vibration resistance characteristics against external vibrations in XYZ-axis directions.

34 Claims, 17 Drawing Sheets

(51) Int. Cl.
    *H01R 12/73*     (2011.01)
    *H05K 1/18*     (2006.01)
    *H05K 7/14*     (2006.01)

(52) U.S. Cl.
    CPC ........... *H05K 1/181* (2013.01); *H05K 7/1438* (2013.01); *G06F 2213/0026* (2013.01); *G06F 2213/0042* (2013.01); *H05K 2201/10159* (2013.01); *H05K 2201/10189* (2013.01)

(56) References Cited

U.S. PATENT DOCUMENTS

| | | | |
|---|---|---|---|
| 2015/0342095 A1* | 11/2015 | Tanaka | H05K 7/20736 361/679.51 |
| 2017/0018541 A1* | 1/2017 | Yi | H01L 23/3675 |
| 2017/0269871 A1* | 9/2017 | Khan | G06F 3/0673 |
| 2018/0088639 A1* | 3/2018 | Remis | G06F 1/206 |

FOREIGN PATENT DOCUMENTS

| | | |
|---|---|---|
| KR | 20170006240 | 1/2017 |
| KR | 20170040897 | 4/2017 |
| KR | 20170052419 | 5/2017 |
| KR | 20170136330 | 12/2017 |

OTHER PUBLICATIONS

PCT Written Opinion—PCT/KR2019/006772 dated Sep. 19, 2019, citing KR 10-2017-0136330, KR 10-2017-0052419, KR 10-2014-0110004, KR 10-2014-0145216, and KR 10-2017-0006240.

\* cited by examiner

SSD MULTIPLER WITH VIBRATION RESISTANCE AND STRUCTURE FOR STACKING SSD MEMORY CARDS OF VARIOUS SIZES IN HORIZONTAL SLIDING MANNER

TECHNICAL FIELD

The present invention relates to a new solid-state drive (SSD) multiplier in which a memory capacity is maximized by arranging M.2 SSD memory cards, in which unit chip memory elements are arranged at a space of the size of a 3.5-inch hard disk drive in a row, as well as M.3 SSD memory cards, each of which has a width greater than that of the M.2 SSD memory card but has twice the capacity of the M.2 SSD memory card by arranging unit chip memory elements in two rows, in a horizontally arranged manner and a vertical multi-stage stacked structure.

In addition, in order to maximize the memory capacity of the SSD multiplier while lowering the price thereof, the M.2 SSD memory cards or the M.3 SSD memory cards horizontally arranged are removed by using a memory card guide holder. Further, the present invention relates to an SSD multiplier capable of reducing the number of layers of a printed circuit board by utilizing the space physically occupied by the above-described memory card guide holder as a space for wiring between an SSD controller and a unit memory device, and simultaneously, lowering the overall price by using one SSD controller and one connection connector for a single layer instead of using the SSD controller and memory card connection connector provided for each of installed M.2 SSD memory cards or M.3 SSD memory cards, by replacing the memory cards with one full-scale SSD memory card through a guide groove formed in each of left/right inner side surfaces of a fixed top cover of the SSD multiplier and installing the full-scale SSD memory card in a vertical multi-stage stacked structure.

Further, the present invention relates to an SSD multiplier provided with a method for protecting M.2 SSD memory cards, M.3 SSD memory cards, or full-scale SSD memory cards installed in the SSD multiplier from vibrations in all directions of X, Y, and Z axes generated due to external vibrations that are caused by various cooling fans or hard disk drives in a computer system in which the SSD multiplier is installed, which is an issue that has been overlooked in a conventional SSD multiplier.

Lastly, in a conventional SSD multiplier, when a memory card is replaced with another memory card of a different length, a top cover should be disassembled, a first vertical connection board should be moved to a first vertical connection board connector corresponding to the length of another memory card to be replaced and connected, and then the top cover should be reassembled, and the SSD multiplier is used. The present invention relates to an SSD multiplier enabling simple replacement of a memory card with another memory card of a different length even without separating a fixed top cover from a bottom cover due to the structure of a fixed backplane board, a fixed top cover, and a detachable top cover, in which a fixing groove of a short memory card is exposed.

BACKGROUND ART

A solid-state drive (SSD) multiplier 100 in a 3.5-inch hard disk drive type according to the related art is described as follows with reference to a block diagram of FIG. 1, an exterior view of FIG. 3, and an exploded perspective view of FIG. 4 that corresponds to the block diagram of FIG. 1.

As shown in FIG. 2, M.2 SSD memory cards 150 have lengths in a horizontal direction of 60 mm, 80 mm, and 110 mm for the same vertical width. Although there are more lengths that are less than these horizontal lengths in a specification for an M.2 SSD memory card, since the memory card capacity varies in proportion to the length, the M.2 SSD memory card 150 having lengths of 60 mm or less has a problem in that the supported capacity is remarkably small for use as a unit memory card, and thus is unsuitable for use as a memory card for a mass storage device.

For the M.2 SSD memory card 150, an 80 mm M.2 SSD memory card is most commonly used, but in terms of capacity, a 110 mm M.2 SSD memory card is the largest.

In order to briefly describe the contents of the related art, a method in which the conventional SSD multiplier 100 supports the M.2 SSD memory cards 150 with lengths of 80 mm and 110 mm will be described with reference to the block diagram of FIG. 1 as follows.

As a data input/output connection device based on a Serial Advanced Technology Attachment (SATA) or Peripheral Component Interconnect Express (PCIe) interface with respect to the outside, an SFF-8639 connector 111 is used, which is directly connected to a control unit 117 in the form of a data bus.

Further, a universal serial bus (USB) connector 113 is provided so as to be easily connected to any computer (not shown) when the SSD multiplier 100 is used as a portable data storage device, and is connected to a USB port of the control unit 117.

Meanwhile, a series of M.2 SSD memory cards 151 to 158 are inserted into first to eighth storage media connectors 141 to 148 provided in a first vertical connection board 136.

Here, the first vertical connection board 136 is connected to a connector selected from among first vertical connection board connectors 121, 123, and 125 that are provided on a second vertical connection board 127 and used as connectors for M.2 SSDs arranged in a vertical direction, wherein the selected connector allows lengths of the M.2 SSDs to be aligned with an entrance provided on an end surface of the SSD multiplier as shown in the exploded perspective view of FIG. 4.

The second vertical connection board 127 is connected to the control unit 117 and a SATA or PCIe bus through a second vertical connection board connector 119.

Accordingly, in the conventional SSD multiplier, regardless of whether M.2 SSDs are arranged horizontally or vertically, for short and long memory cards, as shown in accompanying FIG. 2, fixing grooves 31 of the M.2 SSD memory cards 150 should be aligned in a row on an inner surface of the entrance cover 173 of accompanying FIG. 3. Accordingly, the first vertical connection board 136 should be fitted with one of the first vertical connection board connectors 121, 123, and 125 provided on the second vertical connection board 127, and then a top cover 170 is coupled to a bottom cover 180. In addition, when the SSD multiplier, which is configured with short memory cards, is changed to the configuration of long memory cards, or the SSD multiplier configured with long memory cards is changed to the configuration of short memory cards, the top cover 170 should be completely separated from the bottom cover 180, and the position of the first vertical connection board 136 should be moved to one of the first vertical connection board connectors 121, 123, and 125, which is suitable for the lengths of the memory cards, and then the top cover 170 should be reassembled.

Meanwhile, the SSD multiplier is installed in a computer environment, in which hard disk drives or various fans are installed in addition to the SSD multiplier and thus external vibrations are constantly induced due to the operation of motors built-in the hard disk drives or various fans and actuators for driving headers of the hard disk drives.

Accordingly, components such as a central processing unit (CPU), a main memory card, various PCIe cards including a graphic card, and a storage device, which are installed in a computer, should be firmly fixed to a motherboard or a case chassis for the stability of the computer.

However, as shown in FIGS. 4 and 5, although the conventional SSD multiplier includes various guide protrusions 182, 185, 201, and 202, which serve to guide the M.2 SSD memory card to be correctly inserted, an M.2 memory card fixing groove guide protrusion 191, which is in close contact with the fixing groove of the M.2 SSD memory card and serves to prevent the M.2 SSD memory card from being separated, and an M.2 memory card fixing groove 193, due to physical clearances between the SSD memory card and these components, each of the M.2 SSD memory cards 151 to 158 may not be firmly fixed. As a result, the M.2 SSD memory cards 151 to 158 are exposed to vibrations constantly transmitted from the outside while using a computer, and finally, at a certain time point, contacts between pins inside the series of storage media connectors 141 to 148, which are provided on the first vertical connection board, and edge fingers (not shown) of the M.2 SSD memory cards may be worn and thus the installed M.2 SSD memory cards may not operate properly.

DISCLOSURE

Technical Problem

A first object of the present invention is to provide a solid-state drive (SSD) multiplier capable of supporting various types of SSD memory cards.

The object is to provide an SSD multiplier capable of accommodating full-scale SSD memory cards, in which several M.2 SSD memory cards or M.3 SSD memory cards arranged horizontally in an SSD multiplier of the present invention are replaced by one memory card, or the M.3 SSD memory cards without being limited to the M.2 SSD memory cards based on a peripheral component interconnect express (PCIe) or serial advanced technology attachment (SATA) interface.

A second object of the present invention is to provide an SSD multiplier with a low price.

In a structure in which several unit SSD memory cards are arranged horizontally and mounted, an SSD controller should be mounted on each of the SSD memory cards, and connectors on a backplane board for connecting each of the SSD memory cards should also be provided in a quantity corresponding to the number of mounted SSD memory cards, which is a factor that increases the price.

In order to solve such a problem at once, a single card corresponding to an area in which several unit SSD memory cards are horizontally arranged is designed, and a plurality of non-volatile storage devices are provided in one SSD controller. Accordingly, only one SSD controller and one connector are used for the configuration, and a memory card guide holder for horizontally arranging and guiding several M.2 SSD memory cards or M.3 SSD memory cards is not used. As a result, additional non-volatile storage devices may disposed in a physical space that is occupied by the memory card guide holder, or a space in which the components are placed may be maintained with more margin which may be utilized for wiring of a printed circuit board (PCB), so that a memory card at a lower price is provided while reducing the number of layers constituting the PCB and increasing memory capacity.

A third object of the present invention is to provide a case that is easy to install or replace in correspondence with both small and great lengths of SSD memory cards, and provide a memory card support structure allowing SSD memory cards, which are installed at a place with vibrations in all directions of X, Y, and Z axes, to have vibration resistance characteristics against external vibrations.

A fourth object of the present invention is to provide an SSD multiplier with enhanced external interface performance.

The SSD multiplier of the present invention significantly increases the capacity by providing high-capacity SSDs through horizontal arrangement and vertical multi-layer stacking methods to connectors, which are arranged horizontally and vertically on a fixed backplane board. In addition to providing the increase in storage capacity, it is the object to provide the SSD multiplier that may provide an interface environment with improved overall performance by providing additional interface connectors in addition to interface connectors, which are provided basically, to improve interface performance and connecting each of the additional interface connectors to a control unit.

A fifth object of the present invention is to provide an SSD multiplier in which a light-emitting diode (LED) display unit is controlled differently depending on the type of control unit.

Depending on the control unit used in the SSD multiplier of the present invention, the control unit has a redundant array of independent disks (RAID) function, and pins configured to output operation state information on the provided SSD memory cards are provided. Accordingly, when the LED display unit is driven and the control unit is a PCIe switch, an SSD multiplier that drives the LED display unit by receiving state information on each SSD memory card from an external computer system, to which the SSD multiplier of the present invention is connected, is provided.

Technical Solution

One aspect of the present invention provides a solid-state drive (SSD) multiplier including a printed circuit board including an interface connection means for peripheral component interconnect express (PCIe), non-volatile memory express (NVMe), or serial advanced technology attachment (SATA), at least one or more non-volatile memory cards that support a PCIe, NVMe, or SATA interface method, a bottom cover on which the printed circuit board is mounted and fixed, a fixed top cover that is coupled corresponding to the bottom cover and has a shape in which a portion corresponding to an opposite side of the interface connection means is open, a detachable top cover coupled to the open portion of the fixed top cover and the bottom cover, a control unit connected to the interface connection means for PCIe, NVMe, or SATA, a backplane board fixedly disposed in a vertical direction with respect to the printed circuit board, and memory card connection connectors which are disposed on one side surface of the backplane board and to which the at least one or more non-volatile memory cards are connected, wherein, when the memory card is connected to the memory card connection connector, and the detachable top cover is coupled to the fixed top cover and the bottom cover, a force constantly pushing the short memory card toward the memory card connection connector is applied by an elastic body of a memory card holder provided inside the detachable top cover, and accordingly, the memory card connected to the memory card connection connector remains in close contact with the memory card connection connector.

The printed circuit board may include at least one or more lower backplane board connectors at a position where a lower end portion of the backplane board is located, and the lower backplane board connector may make a circuit connection between the backplane board and the control unit.

When the memory card is a short memory card and is connected to the memory card connection connector, the fixed top cover may allow an end portion of the short memory card to be exposed to the outside, so that the short memory card may be easily removed or inserted when the detachable top cover is removed.

The detachable top cover may include a short memory card holder corresponding to a short memory card when the memory card is the short memory card and is connected to the memory card connection connector, and include a long memory card holder corresponding to a long memory card when the memory card is the long memory card and is connected to the memory card connection connector.

The short memory card holder may include a memory card close contact semicircular protrusion that is in accurate close contact with a semicircular fixing groove provided on the short memory card, a memory card upward/downward separation prevention protrusion for accurately guiding the short memory card to the memory card close contact semicircular protrusion, a holder integrated leaf spring having a central portion on which the memory card close contact semicircular protrusion and the memory card upward/downward separation prevention protrusion are formed, a short memory card holder cross bar from which the leaf spring branches, short memory card holder fixing protrusions provided at left and right ends of the short memory card holder cross bar, and a force constantly pushing the short memory card toward the memory card connection connector may be applied by the elasticity of the holder integrated leaf spring.

The memory card upward/downward separation prevention protrusion may include an inclined surface at each of upper and lower sides thereof, so that the semicircular fixing groove of the short memory card is accurately guided to the memory card close contact semicircular protrusion.

The short memory card holder fixing protrusions of the side surfaces of the detachable top cover may be coupled to the detachable top cover through short memory card holder fixing grooves and short memory card holder guide grooves that are provided in the detachable top cover, so that the short memory card holder may be fixed to the detachable top cover.

The long memory card holder may include an upper memory card close contact semicircular protrusion and a lower memory card close contact semicircular protrusion that are in accurate close contact with a semicircular fixing groove provided in the long memory card, long memory card upward/downward separation prevention protrusions for accurately guiding the long memory card to the memory card close contact semicircular protrusion, a compression spring inlet provided in a form of an opening hole in the long memory card holder in an opposite direction of the memory card close contact semicircular protrusion, a compression spring locking protrusion, a compression spring provided inside the compression spring inlet, upper and lower long memory card holder circular protrusions inserted into corresponding holes provided in the detachable top cover, and a long memory card holder support guide groove into which a long memory card holder support is inserted so that a series of long memory card holders may be supported so as not to be separated.

The memory card upward/downward separation prevention protrusion may include an inclined surface at each of upper and lower sides thereof, so that the semicircular fixing groove of the long memory card may be accurately guided to the long memory card close contact semicircular protrusion by the upward/downward separation prevention protrusion.

Due to loose coupling of a long memory card holder support separation prevention guide of a long memory card holder support cross bar and the long memory card holder support guide groove of the long memory card holder, loose coupling of the long memory card holder circular protrusions and guide holes of the detachable top cover, and an elastic force of the compression spring inserted into the compression spring inlet and provided between the compression spring locking protrusion of the long memory card holder and the detachable top cover, the long memory card holder may be repulsed from an inner side surface of the detachable top cover without being separated along the long memory card holder support separation prevention guide, so that when the detachable top cover is coupled to the fixed top cover and the bottom cover, the force that constantly pushes the memory card toward the memory card connection connector may be applied.

The long memory card holder may be provided at an inner side of a vertical surface of the detachable top cover and integrated therewith.

The SSD multiplier may include memory card guide holders disposed vertically at equal intervals between the fixed top cover and the printed circuit board, and memory card guide grooves provided at side surfaces of the memory card guide holder, wherein the memory card may be guided along the memory card guide grooves and connected to the memory card connection connector.

Each of the memory card guide holders may include a memory card side holder provided on an inner side thereof along the memory card guide groove in a direction parallel to the memory card guide groove and a semicircular protrusion provided at an end portion of the memory card side holder, and the memory card may be supported by the elasticity of the memory card side holder generated when a side surface of the memory card presses the side holder semicircular protrusion provided at the end portion of the memory card side holder in a process in which the memory card is guided along the memory card guide groove and connected to the memory card connection connector.

In order for the memory card to be smoothly inserted into the memory card guide groove from a direction opposite to the memory card connection connector, the memory card guide holder may include a guide inclined surface at the entrance of the memory card guide groove so that the memory card may be allowed to be inserted more easily.

A memory card guide holder upper fixing protrusion of the memory card guide holder may be coupled to a memory card guide holder fixing groove provided on a lower surface of the fixed top cover, so that the memory card guide holder may be fixed to the fixed top cover.

The memory card guide holder may additionally include a horizontal support at an upper end thereof, and the horizontal support of the memory card guide holder is in surface contact with the lower surface of the fixed top cover, so that the memory card guide holder may maintain a more stable vertical state with respect to the fixed top cover.

In order for the detachable top cover to be reliably coupled to the fixed top cover and the bottom cover and prevented from being unintentionally separated therefrom, a detachable top cover upper coupling protrusion, which overlaps the fixed top cover when the detachable top cover is coupled, may be provided on an upper surface of the detachable top cover, and in order for the detachable top cover to be coupled to the bottom cover, a detachable top cover lower outer coupling protrusion protruding from a lower inner edge portion of a vertical surface of the detachable top cover may be provided, so that the detachable top cover may be coupled to the bottom cover.

In order to induce the release of the coupling of the detachable top cover upper coupling protrusion coupled to the fixed top cover, the detachable top cover may include an upper coupling release guide groove, which is surface-down treated in a U-shape, as an indication to press a center portion of the upper surface of the detachable top cover.

In order for the detachable top cover to be coupled to the bottom cover, the detachable top cover may include a lower inner coupling protrusion protruding from an inner portion of each of left and right corners at a lower inner surface of the vertical surface of the detachable top cover, and a lower inner coupling protrusion fastening hole and a coupling hole of the bottom cover, which is adjacent to the lower inner coupling protrusion fastening hole, may be fixed using a separate fastening means in a state in which the detachable top cover is coupled to the fixed top cover and the bottom cover.

In order for the detachable top cover to be coupled to the bottom cover, the detachable top cover may include the lower inner coupling protrusion protruding from the inner portion of each of the left and right corners at the lower inner surface of the vertical surface of the detachable top cover, and the lower inner coupling protrusion may be coupled to a corresponding groove of the bottom cover in a state in which the detachable top cover is coupled to the fixed top cover and the bottom cover.

The memory card may be an M.2 SSD memory card, an M.3 SSD memory card, or a full-scale SSD memory card.

The full-scale SSD memory card may include at least one or more semicircular memory card fixing grooves in an end surface thereof at an opposite side of an edge finger portion that is coupled to the memory card connection connector.

The full-scale SSD memory card may include at least one or more light-emitting diodes (LEDs) indicating various operating states in the vicinity of the end surface thereof at the opposite side of the edge finger portion that is coupled to the memory card connection connector.

The full-scale SSD memory card may include at least one or more semicircular memory card fixing grooves in an end surface thereof at an opposite side of an edge finger portion that is coupled to the memory card connection connector.

The fixed top cover further may include side covers, which have a detachably attached structure, on left and right side surfaces thereof.

A memory card side holder facing inward may be formed on each of the side covers.

Memory card side holders facing inward may be formed on left and right side surfaces of the fixed top cover.

At least one or more memory card connection connectors may be arranged horizontally and vertically on the backplane board so that the memory cards may be coupled in a horizontal arrangement and a multi-stage stacking method.

In the memory card connection connectors arranged on the backplane board, the memory cards disposed on an upper stage may be replaced with an LED light guide plate, and the LED light guide plate may be utilized as an LED display unit for the memory cards provided at a lower stage.

The interface connection means for PCIe, NVMe, or SATA may be physically separated into a first connector and a second connector and connected to the control unit.

The SSD multiplier may include a third connector configured to perform universal serial bus (USB) interfacing with the outside, a bus converter connected to the third connector to convert a USB interface signal, a second controller connected to the bus converter, and an LED display unit operated by an output signal of the second controller to display operation state information.

The control unit may include a first controller configured as a redundant array of independent disks (RAID) controller, a fault LED signal output from the control unit, a second controller to which the fault LED signal is connected, a bus converter connected to the second controller, and a third connector connected to an output signal converted by the bus converter to perform USB interfacing with the outside.

The control unit may support a RAID function for the memory cards coupled to a first vertical connection board, so that the memory cards may be converted into at least one or more logical storage devices according to a user's designation.

The control unit may be configured as a PCIe switch, is connected in a PCIe x1, x2, or x4 lane configuration to correspond to each of the memory cards, and may be connected to the interface connection means for PCIe through a PCIe x2, x4, or x8 interface.

Advantageous Effects

The present invention provides a high-capacity solid-state drive (SSD) that has the same form factor as a 3.5-inch hard disk drive and has a structure in which memory cards, such as standard M.2 SSD memory cards, standard M.3 SSD memory cards, or non-standard full-scale SSD memory cards, can be inserted in a horizontal sliding manner into an exterior having the same size as the 3.5-inch hard disk drive, and can be provided in a multi-stage arrangement in a vertical direction.

To this end, a specially designed memory card guide holder is provided to configure the M.2 SSD memory cards or M.3 SSD memory cards of a standardized size in a horizontally arranged form.

The memory card guide holder serves to guide the M.2 SSD or M.3 SSD memory card to be inserted smoothly, and also, prevents shaking, in left-right horizontal directions, between the SSD memory card and a connection connector in a space between memory card side holders due to external vibrations caused by an elastic force, which is induced in the memory card side holder by the inserted memory card and caused by having the memory card side holders.

In particular, in order to cope with the provision of standard M.2 SSD memory cards of various lengths, the conventional invention has a structure in which, when M.2 SSD memory cards of different lengths are installed, a case is disassembled, a backplane board to which the M.2 SSD memory cards are connected is separated from a body, the backplane board is moved to a connector corresponding to the length of the M.2 SSD memory card, and then the case is reassembled, which is inconvenient to use. However, the present invention provides a high-capacity SSD case structure having a novel structure in which a vertical backplane board is placed in a fixed position so that even when an SSD memory card is replaced with another SSD memory card of a different length, the case does not need to be disassembled.

A fixed top cover has a certain length, at which a part of an end portion of a short memory card is exposed to the outside when the short memory card is installed, to cope with both the short memory card and a long memory card according to the length of a unit memory card to be used, and on an inner surface of a detachable top cover corresponding to the fixed top cover, a short memory card holder corresponding to the short memory card and a long memory card holder corresponding to the long memory card are installed to prevent the short memory card or the long memory card from being spaced in a direction in which the memory card is inserted due to external vibrations when the short memory card or the long memory card is installed, so that the inserted memory card can be prevented from being separated from a connection connector provided on a backplane board.

Further, an end of an installed memory card can be prevented from moving in a vertical direction due to external vibrations by a memory card upward/downward separation prevention protrusion provided in a short memory card holder and a long memory card holder.

In addition, in order to improve the performance of an external interface according to the increase in capacity, which is obtained due to a horizontal arrangement and a multi-stage stacked structure of memory cards, an expanded interface bus lane, for an additionally provided second connector, is provided in addition to an existing interface bus lane and is connected to a first controller.

Lastly, when a first controller has a redundant array of independent disks (RAID) function, a light-emitting diode (LED) display unit is driven through an output pin of the first controller. When the first controller is configured as a Peripheral Component Interconnect Express (PCIe) switch, the LED display unit is directly driven through the output of a bus converter by receiving signals indicating operation states through a third connector from a computer system to which an SSD multiplier of the present invention is connected, or the LED display unit is driven according to results obtained by a second controller by reading internal registers of the bus converter. Accordingly, the operation state or an error state for an arbitrary unit SSD memory card provided in the SSD multiplier of the present invention is displayed to a user, or, when a failure occurs for any SSD memory card, the exact position is indicated by a fault LED, so that the user can replace the SSD memory card of the corresponding position.

It should be noted that advantageous effects of the present invention are not limited to the above-described effects, and other effects that are not described herein will be apparent to those skilled in the art from the following descriptions.

BEST MODE OF THE INVENTION

Figure 1:
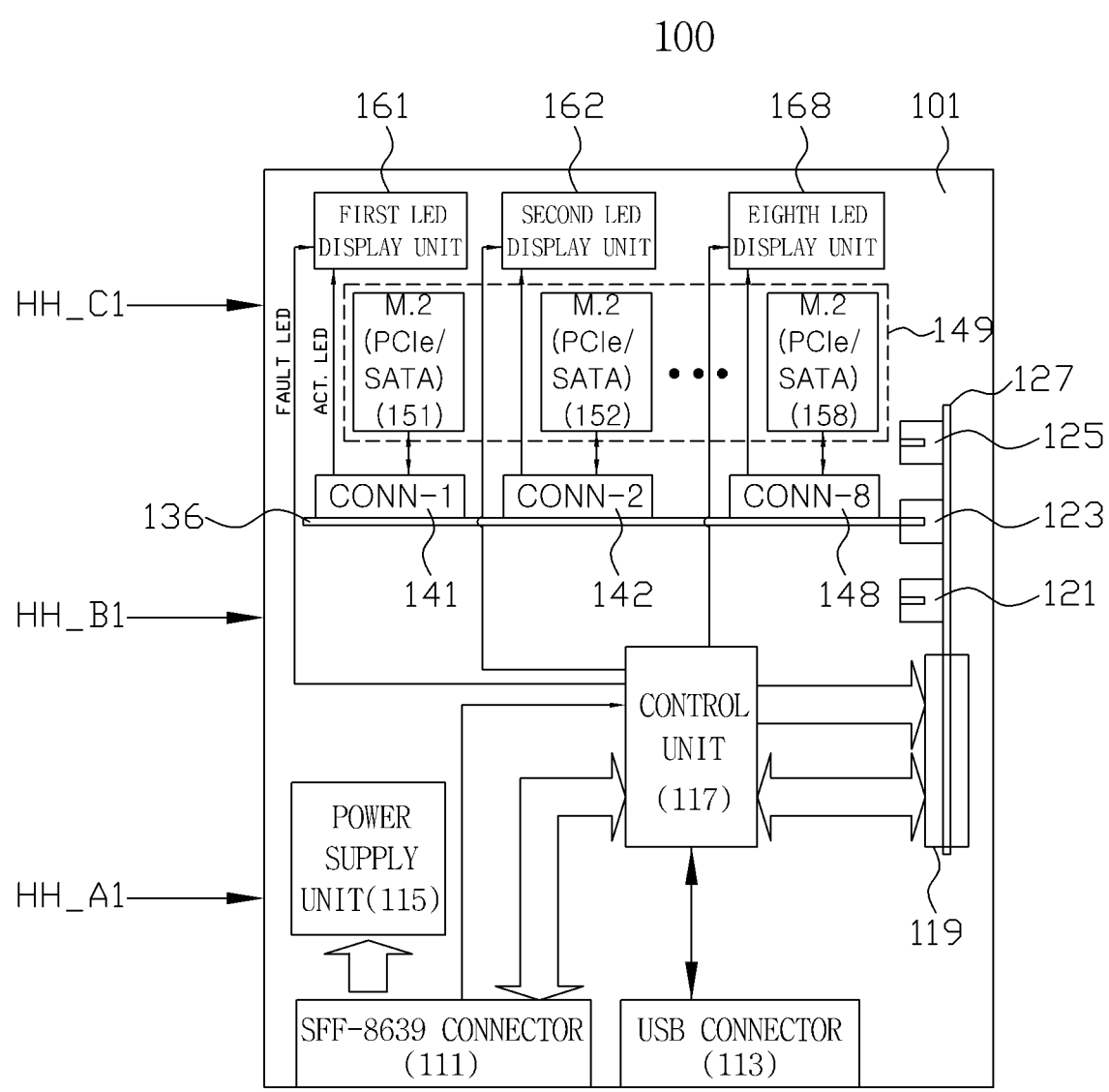
FIG. 1 is a block diagram illustrating a solid-state drive (SSD) multiplier of the related art.

Advantages and features of the present invention and methods of accomplishing the same will be apparent by referring to embodiments described below in detail in connection with the accompanying drawings. However, embodiments of the technical spirit of the present invention may be embodied in various forms and are not to be construed as limited to the embodiments set forth herein. Rather, these embodiments are provided so that this disclosure is thorough and complete, and will fully convey the scope of the present invention to those skilled in the art. Also, embodiments of the technical spirit of the present invention are defined only by the appended claims.

The terminology used herein is for the purpose of describing particular embodiments only and is not intended to be limiting of the invention. Unless the context clearly indicates otherwise, the singular forms include the plural forms.

It should be further understood that the terms "comprises," "comprising," "includes," "including," and/or "having," when used in the present specification, specify the presence of stated features, integers, steps, operations, elements, components, or groups thereof, but do not preclude the presence or addition of one or more other features, integers, steps, operations, elements, components, or groups thereof.

Additionally, the embodiments in the detailed description will be described with sectional views as ideal exemplary views of the present invention. Therefore, the embodiments of the present invention are not limited to the specific forms shown, but may include changes in necessary forms. For example, a region illustrated as a rectangle may be rounded or have a predetermined curvature. Therefore, the regions illustrated in the drawings have schematic properties, and the shapes of the regions illustrated in the drawings are illustrative of specific shapes of regions of a device and are not intended to limit the scope of the present invention.

Like reference numerals refer to like elements throughout. Therefore, although like reference numerals or similar reference numerals are not mentioned or described in the drawing, they will be described with reference to the other drawings. Furthermore, although reference numerals are not illustrated, they will be described with reference to the other drawings.

Hereinafter, a solid-state drive (SSD) multiplier according to an exemplary embodiment of the present invention will be described in detail with reference to the drawings.

Figure 6:
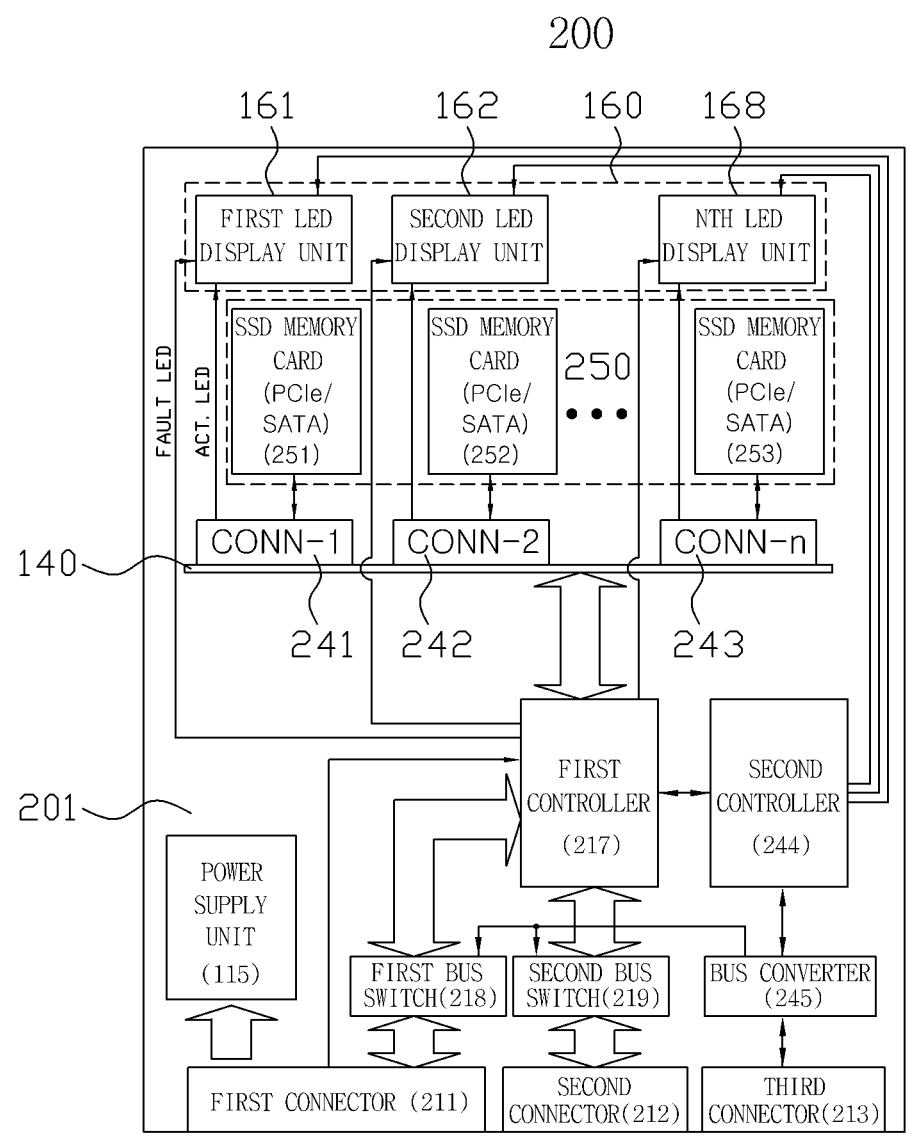
FIG. 6 is a block diagram illustrating an SSD multiplier of the present invention.

FIG. 6 is a block diagram of an SSD multiplier according to the present invention, and each functional block is described according to reference numerals as follows.

In an SSD multiplier 200 of the present invention, a first connector 211, which is connected to an external computer (not shown) and is composed of an SFF-8639 connector, is located on a printed circuit board 201 at the same position as a connector provided in a conventional 3.5-inch hard disk drive, wherein the SFF-8639 connector is equipped with connection pins for serial advanced technology attachment (SATA), serial attached small computer system (SAS), and peripheral component interconnect express (PCIe) interfaces and pins used for power and control signals.

In order to provide a faster external interface suitable for the high-capacity storage capacity of the SSD multiplier 200 of the present invention, a second connector 212, which is composed of a third connector (not shown) supporting the same transmission speed as an optical copper link (OCU-LINK, not shown), an SFF-8643 212, or the PCIe interface pins of the first connector 211, for expanding a PCIe interface bus is positioned next to the first connector 211.

The first connector 211 and the second connector 212 may be directly connected to a first controller 217, and are connected to the first controller 217 through a first bus switch 218 connected to the first connector 211 and a second bus switch 219 connected to the second connector 212.

A third connector 213 is a connector for receiving signals for controlling the first bus switch 218 and the second bus switch 219 generated from an external computer system (not shown) to which the SSD multiplier of the present invention is connected, and is a connector for driving light-emitting diodes (LEDs) of LED display units 161 to 168 constituting the LED display unit 160, and a universal serial bus (USB) connector may be used as the third connector 213.

USB signals input through the third connector 213 are connected to a bus converter 245, and for example, a USB to inter-integrated circuit ($I^2C$) signal converter may be used as the bus converter 245.

Signals for controlling activation/deactivation of the first bus switch 218 and the second bus switch 219 are directly connected to general-purpose input/output (GPIO) pins provided in the bus converter 245, and a second controller 244 is connected to the bus converter 245 in a manner that reads internal registers of the bus converter 245 through an $I^2C$ bus.

A power supply unit 115 receives external power of +5 V and +12 V through the pins provided in the first connector 211 and generates power required to drive various components of the SSD multiplier 200 of the present invention, such as the first controller 217, the second controller 244, the first bus switch 218, the second bus switch 219, the LED display unit 160, and a series of SSD memory cards 251 to 253 connected to a backplane board 140.

The first controller 217 may be configured as a redundant array of independent disks (RAID) controller that supports a RAID function or may be configured as a general PCIe switch that does not support the RAID function.

When the first controller 217 is configured as a RAID controller, RAID setting may be performed on the series of SSD memory cards 251 to 253 connected through the backplane board 140 by software consisting of a graphic user interface and a device driver (DEVICE DRIVER) supported by the RAID controller. Alternatively, the RAID setting may be made simply by RAID setting pins exposed to the outside from the RAID controller.

When the first controller 217 is configured as a RAID controller, LED driving pins, which are provided in the RAID controller and configured to monitor operation states, are connected to the LEDs provided in first to eighth LED display units 161 to 168 constituting the LED display unit 160 in a pin-to-pin manner to drive the LEDs.

Meanwhile, when the first controller 217 is configured as a PCIe switch, the first controller 217 is connected to the series of SSD memory cards 251 to 253, which are connected through the backplane board 140, in a x1, x2, or x4 PCIe lane configuration and is connected to an external computer (not shown) through a PCIe x2 or x4 lane when only the first connector 211 is used, and when the second connector 212 is additionally used, the first controller 217 is connected to the external computer (not shown) through a PCIe x8 lane.

In the external computer system (not shown) to which the SSD multiplier 200 of the present invention is connected, the series of SSD memory cards 251 to 253 recognized by the first controller 217 may be recognized as individual storage, and may be configured as storage with a single volume or storage with multiple volumes through a software-based RAID configuration based on a central processing unit (CPU) (not shown) and a chipset (not shown) of the computer system (not shown) and used.

In this case, for the series of SSD memory cards 251 to 253 recognized as individual storage through the separate program, the computer system (not shown) transmits important operation state information for each of the SSD memory cards 251 to 253 among self-monitoring analysis and reporting technology (SMART) information read from an electrically erasable programmable read-only memory (EEPROM) or flash programmable read-only memory (PROM) (not shown), which is provided in each of the SSD memory cards 251 to 253 and stores various types of state information, to the third connector 213 through the USB port (not shown) of the computer system, and this information is transmitted to the second controller 244 through the bus converter 245.

The second controller 244 connects an LED signal indicating an operating state among the transmitted various types of operation state information to an activity LED constituting the LED display unit 160 and corresponding to each of the SSD memory cards 251 to 253, and connects an LED signal indicating an error state to a fault LED corresponding to each of the SSD memory cards 251 to 253, and thus the operation state of each of the SSD memory cards 251 to 253 is displayed while the SSD multiplier 200 of the present invention is being used.

When the first controller 217 is configured as a RAID controller, control signals for driving fault LEDs of the LED display unit 160 are also transmitted to the second controller 244, the second controller 244 transmits the signals to internal registers designated in the bus converter 245 connected by an I²C bus, and the external computer system (not shown) reads values of the registers through the third connector and displays the position of any SSD memory card, in which an error has occurred, through the graphic user interface.

The backplane board 140 includes edge finger portions (not shown), which are inserted into at least one or more backplane board lower connectors (not shown) connected to the first controller 217 to form electrical circuit connections, at a lower portion thereof in a quantity corresponding to number of backplane board connection connectors (not shown) for the backplane board connection, and is inserted into the backplane board connection connector (not shown).

Figure 2:
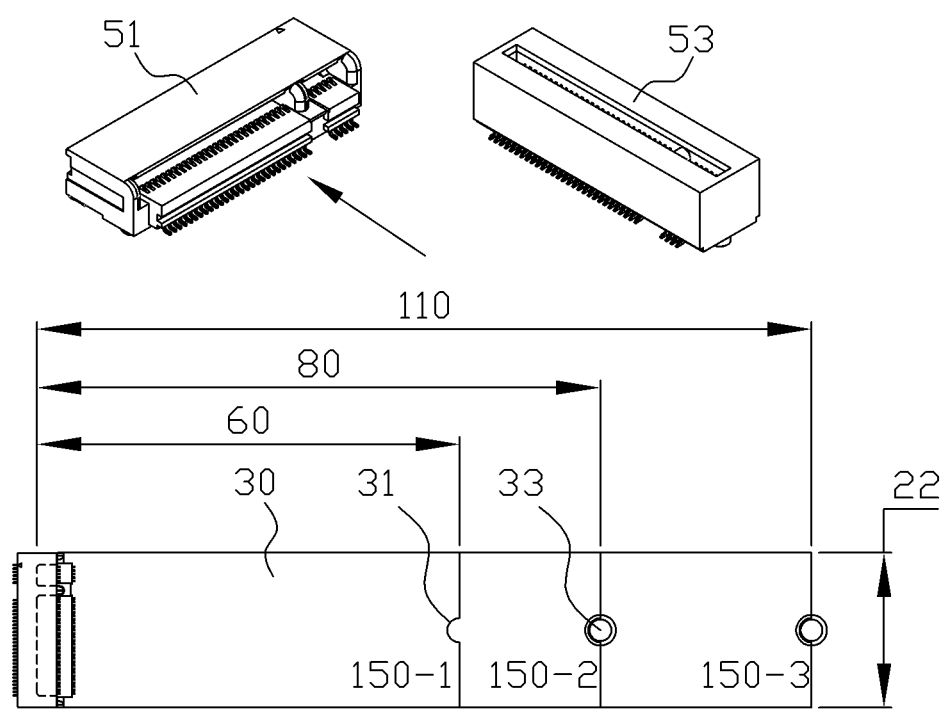
FIG. 2 is a view illustrating connectors, to which M.2 SSD memory cards are connected and which are used in the present invention and in the related art, and the M.2 SSD memory cards of various lengths coupled to the connectors.
Figure 3:
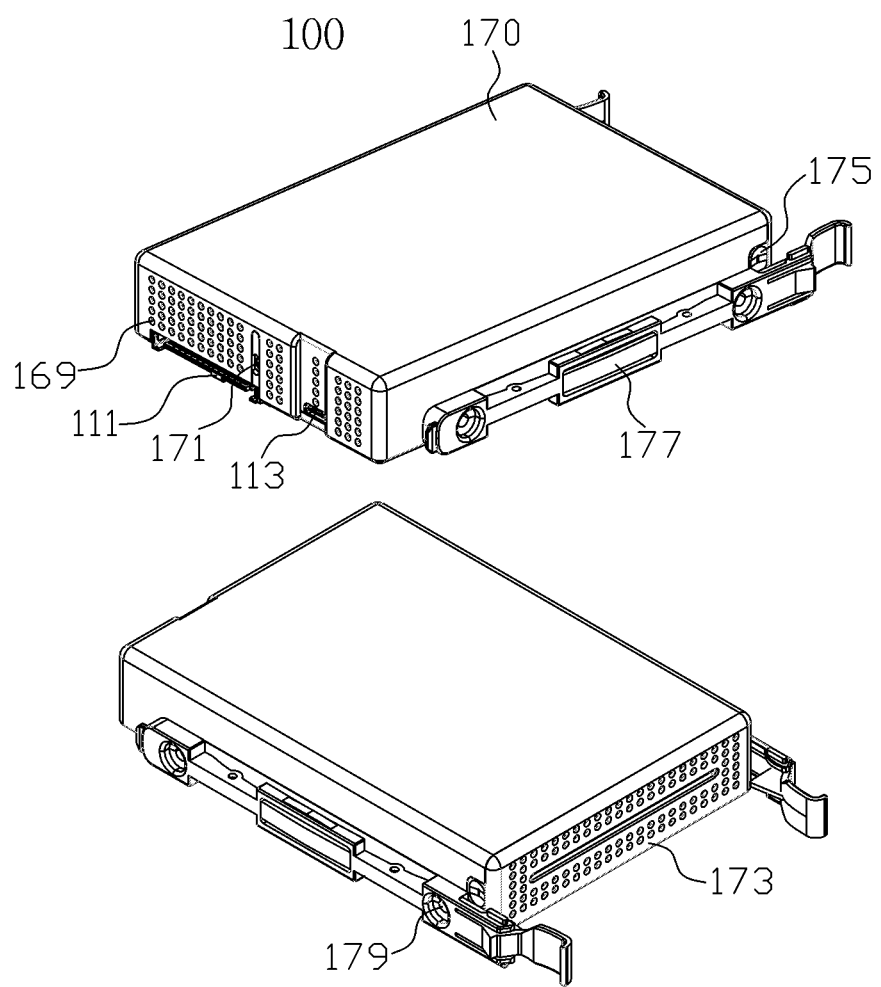
FIG. 3 is a perspective view of the SSD multiplier according to the related art.
Figure 4:
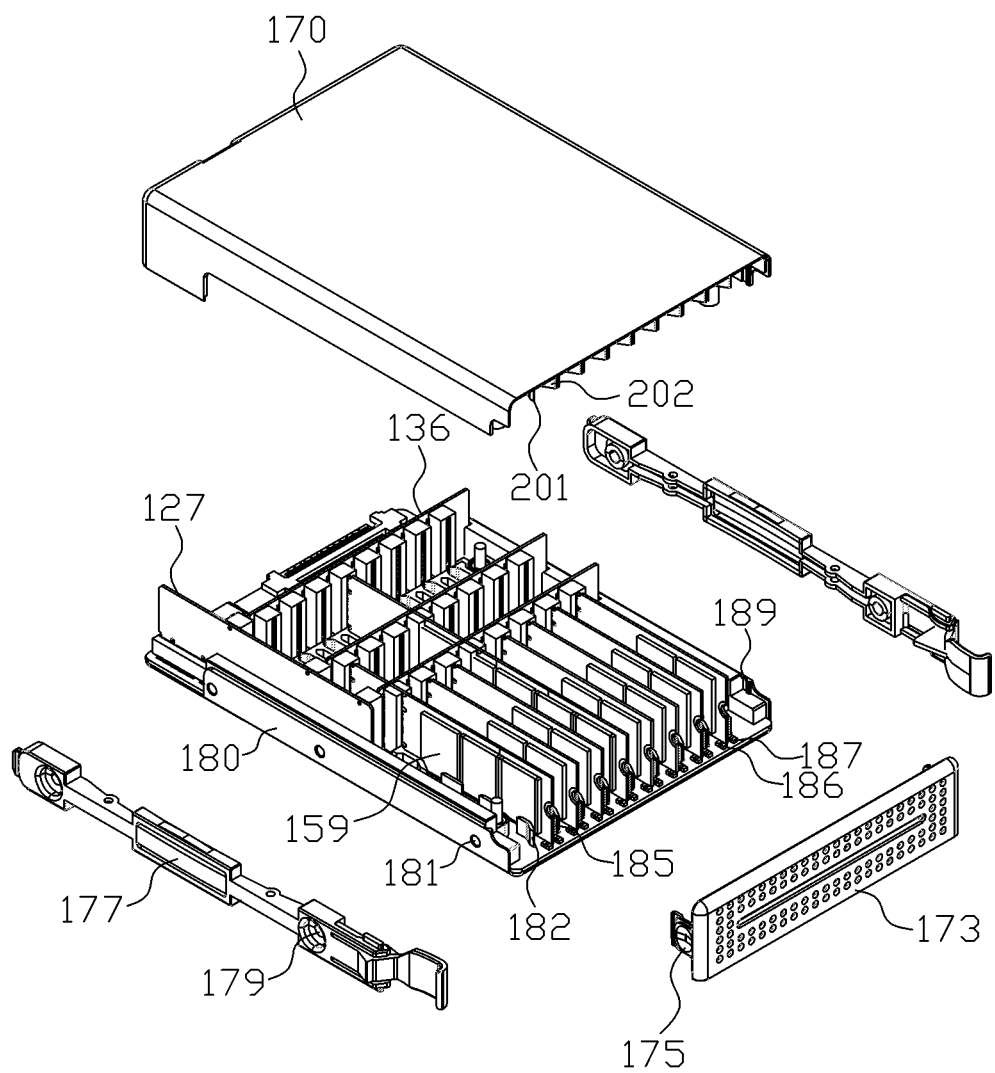
FIG. 4 is an exploded perspective view of the SSD multiplier of the related art.
Figure 5:
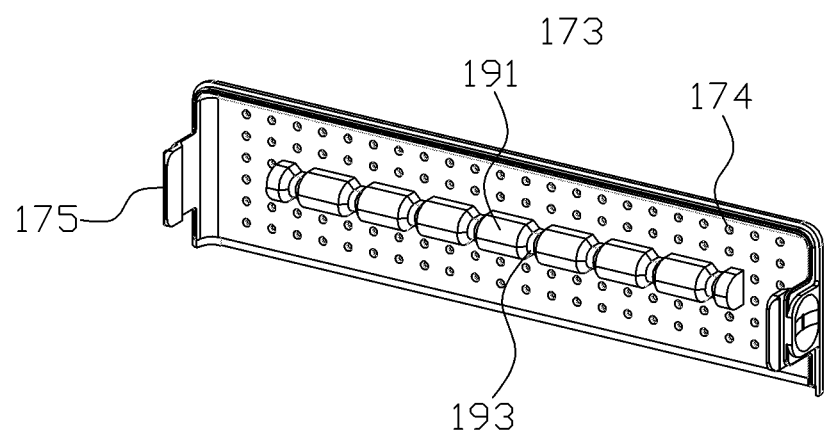
FIG. 5 is a perspective view of a storage media entrance cover according to an embodiment of the related art.

Vertical connectors the same as or of the same type as the M.2 SSD memory card 53 illustrated in FIG. 2 are arranged horizontally/vertically on one side of the backplane board 140 to form first to eighth memory card connection connectors 241 to 243.

The SSD memory cards 251 to 253 are installed by being inserted into the first to eighth memory card connection connectors 241 to 243 provided on the backplane board 140, respectively.

Regarding signals for driving the LED display unit 160, even though it has been described that signals transmitted from the external computer system (not shown) to which the SSD multiplier 200 of the present invention is connected are output through the path of the third connector 213→the bus converter 245→the second controller 244 when the first controller 217 is configured as a PCIe switch, and are output from the first controller 217 when the first controller 217 is configured as a RAID controller, activity LEDs in the LED display unit 160 may be operated by activity LED driving signals, which are directly output from the SSD memory cards 251 to 253 through a series of connectors 241 to 243 arranged on the backplane board 140 including the first memory card connection connector 241.

Accordingly, the driving of the activity LEDs of the LED display unit 160 may be selectively responded to according to the configuration method of a circuit design.

Figure 7:
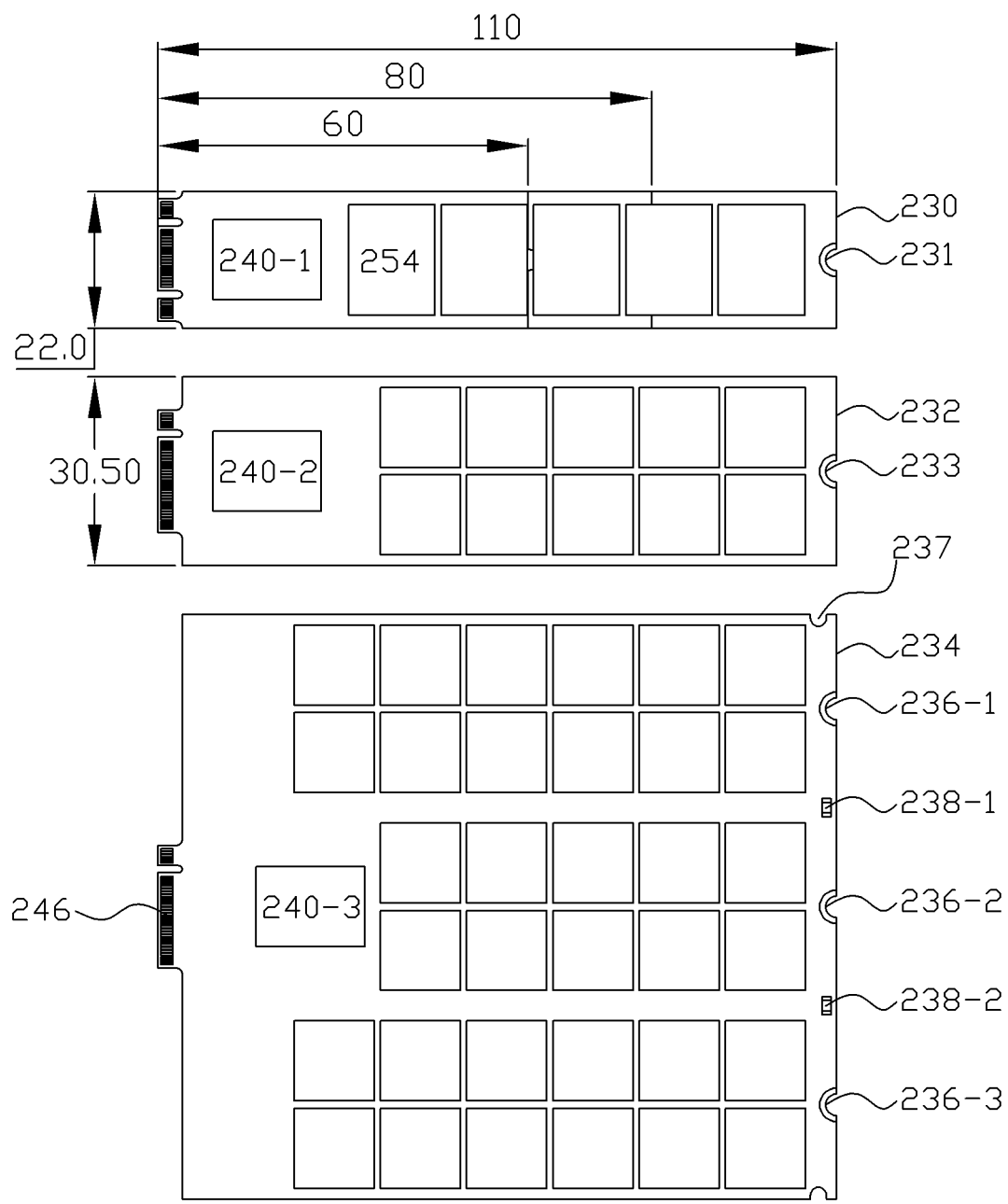
FIG. 7 is an exterior view of a standard M.2 SSD memory card, a standard M.3 SSD memory card, and a non-standard full-scale SSD memory card according to an embodiment of the present invention, which are used in the SSD multiplier of the present invention.

Meanwhile, as the SSD memory cards 251 to 253 used in the SSD multiplier 200 of the present invention, a standard M.2 SSD memory card 230 or M.3 SSD memory card 232 may be used, or a non-standard full-scale SSD memory card 234 of the present invention may be used as shown in FIG. 7.

As shown in FIG. 7, the M.2 SSD memory card 230 includes an edge finger portion whose width is constant at 22.0 mm, but has a length of 60 mm, 80 mm, and 110 mm. Although the M.2 SSD memory card 230 may have a length of less than 60 mm, as the length decreases, the number of provided memory devices 254 proportionally decreases, and thus, in the following description, no reference is made to the length of 60 mm or less, but the spirit of the present invention is applied in the same manner to a memory card having a small length.

In the following description, a memory card having a length of 80 mm is expressed as a short memory card 230-1, and a memory card having a length of 110 mm is expressed as a long memory card 230-2, but even when memory cards of different lengths are applied, the fundamental purpose of the present invention is the same.

As shown in FIG. 7, in the case of the M.2 SSD memory card 230, the unit memory storage devices 254 may be arranged only in a row, but in the case of the M.3 SSD memory card 232, the same edge finger may be used, but only a width is increased from 22.0 mm to 30.5 mm, and thus it is possible to arrange the unit memory storage devices 254 in two rows, so that storage capacity that is twice the storage capacity of the M.2 SSD memory card 230 may be provided for the same length.

The full-scale SSD memory card 234 presented in the present invention has the same edge finger as the M.2 SSD memory card 230 or the M.3 SSD memory card 232 and has a horizontal width that allows the full-scale SSD memory card 234 to be inserted along uneven guide grooves 235 formed in left/right inner side surfaces of a fixed top cover 270.

The number of LED display units 160 varies depending on whether the used SSD memory cards 215 to 253 are M.2 SSD memory cards 230, M.3 SSD memory cards 232, or full-scale SSD memory cards 234 and the number of stages in a vertical stack configuration.

Figure 9:
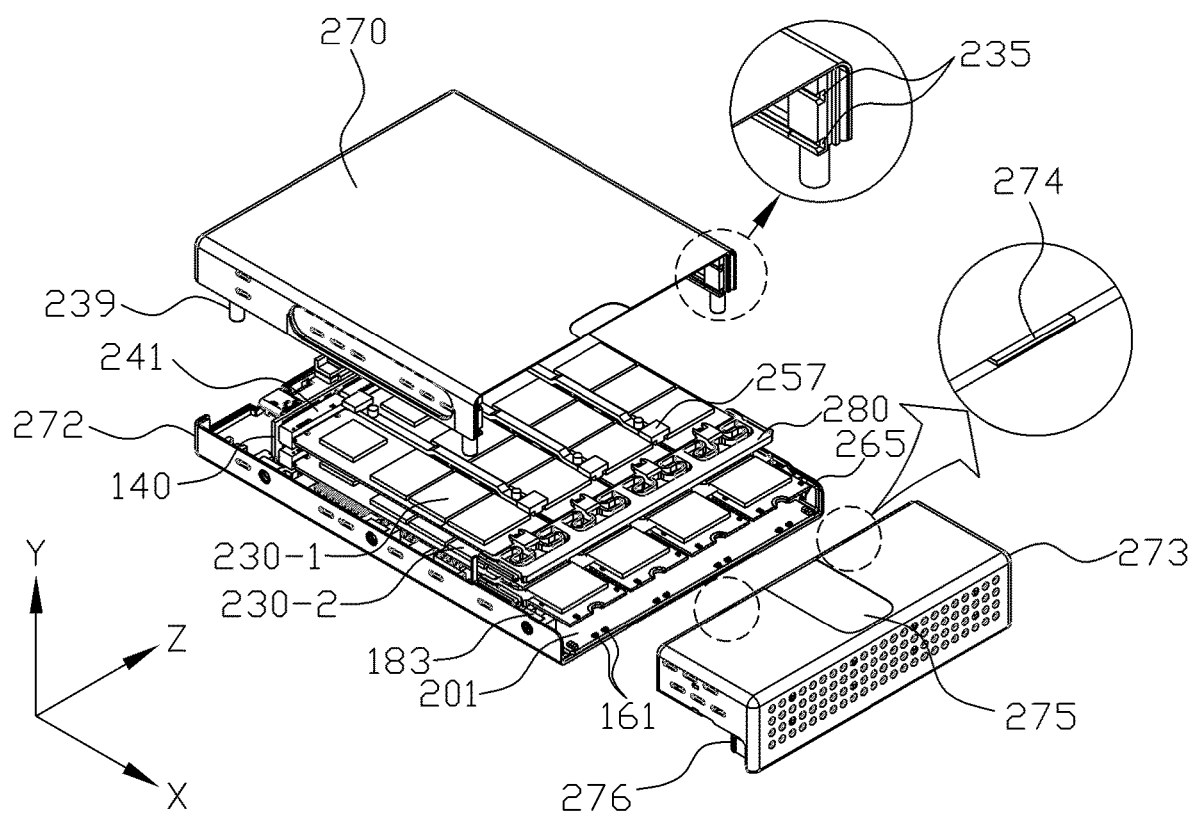
FIG. 9 is an exploded perspective view of the SSD multiplier according to the embodiment of the present invention.

According to the embodiment of the present invention, as shown in FIG. 9, a total of eight M.2 SSD memory cards 230 are provided through a four horizontal array arrangement and vertical two-stage configuration, and accordingly, in detail, the LED display unit 160 is also composed of eight LED display units 161 to 168.

In the embodiment using the M.2 SSD memory card 230 of FIG. 9, the LED display units 161 to 164 for four M.2 SSD memory cards 230 arranged on an upper stage are provided at an upper end of an outer side surface of the printed circuit board 201, which is the point at which the memory card is entered, the LED display units 165 to 168 for the remaining four M.2 SSD memory cards 230 arranged at a lower stage are provided at a lower end of the outer side surface of the printed circuit board 201, and the LED display units 161 to 168 are aligned with a center line of the corresponding M.2 SSD memory card 230.

Since a total of eight M.2 SSD memory cards 230 are used in the application case of the M.2 SSD memory card 230, it can be seen that a total of eight memory controllers 240-1 for the M.2 SSD are used and a total of eight memory card connection connectors 241 to 243, which are provided on the backplane board 140 to connect each M.2 SSD memory card, are also used.

Figure 16:
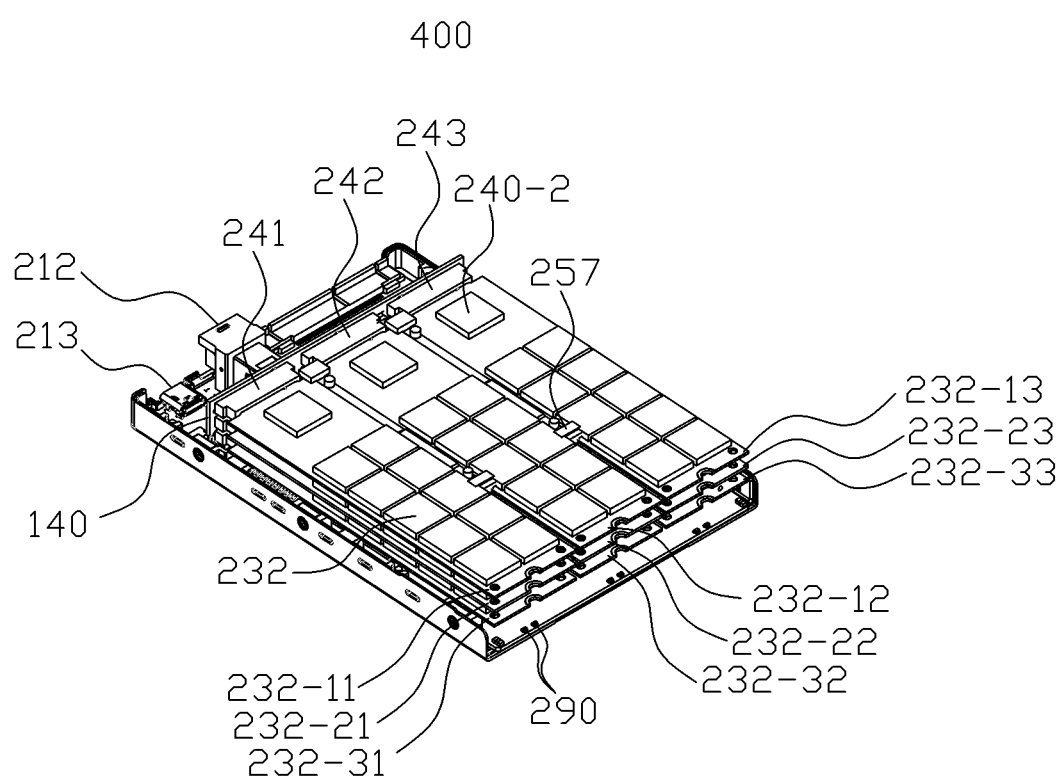
FIG. 16 is a perspective view of an SSD multiplier according to an embodiment of the present invention, in which the M.3 SSD memory cards are arranged in three horizontal arrays and three vertical stages in a state in which the fixed top cover and the detachable top cover are open.
Figure 17:
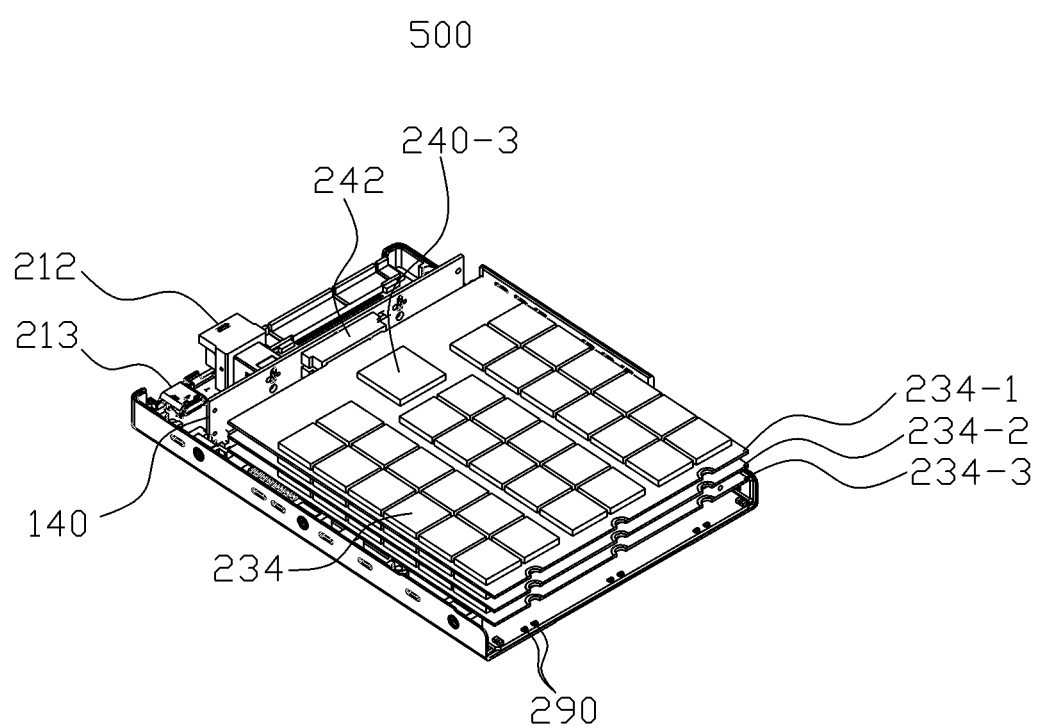
FIG. 17 is a perspective view of an SSD multiplier according to an embodiment of the present invention, in which the full-scale SSD memory cards are arranged in three vertical stages in a state in which the fixed top cover and the detachable top cover are open.

In the case of applying the M.3 SSD memory card 232 and the full-scale SSD memory card 234, reference is respectively made to FIGS. 16 and 17. When the vertical two-stage configuration is applied in the same manner as the application example of the M.2 SSD memory card 230 of FIG. 9, in the case of applying the M.3 SSD memory card 232, six memory controllers 240-2 for the M.3 SSD and six memory card connection connectors 241 to 243 are used, and in the case of applying the full-scale SSD memory card 234, two memory controllers 240-3 for the full-scale SSD and two memory card connection connectors 241 to 243 are used.

That is, this indicates that the use of the SSD memory card having a greater area is advantageous in reducing the price of the SSD memory card of the present invention.

The full-scale SSD memory card shown in FIG. 7 has a vertical width equal to the sum of the vertical widths of four M.2 SSD memory cards 230 or three M.3 SSD memory cards 232, and since the width is increased, a full-scale SSD memory card separation groove 237 for separation and three full-scale SSD memory card fixing grooves 236 are provided.

In addition, since the full-scale SSD memory card 234 is a non-standard memory card optimized for the SSD multiplier 200 of the present invention, the LED display unit 160 may not be provided at the upper/lower ends of one side surface of the printed circuit board 201, and an activity LED 238-1 and a fault LED 238-2 for a full-scale SSD memory card may be directly provided on the full-scale SSD memory card 234, thereby increasing intuitiveness.

To this end, the activity LED 238-1 for a full-scale SSD memory card is connected to an activity LED driving pin (not shown) output from the memory controller 240-3 for a full-scale SSD of the full-scale SSD memory card 234, the fault LED 238-2 for a full-scale SSD memory card is connected to a reserved pin of an edge finger portion 246, and the corresponding reserved pin may be connected to an output pin of an AND device (not shown) whose input pin is connected a fault LED pin (not shown) output from each of the first controller 217, the second controller 244, or the first controller 217 and the second controller 244, thereby driving the fault LED 238-2.

Figure 8:
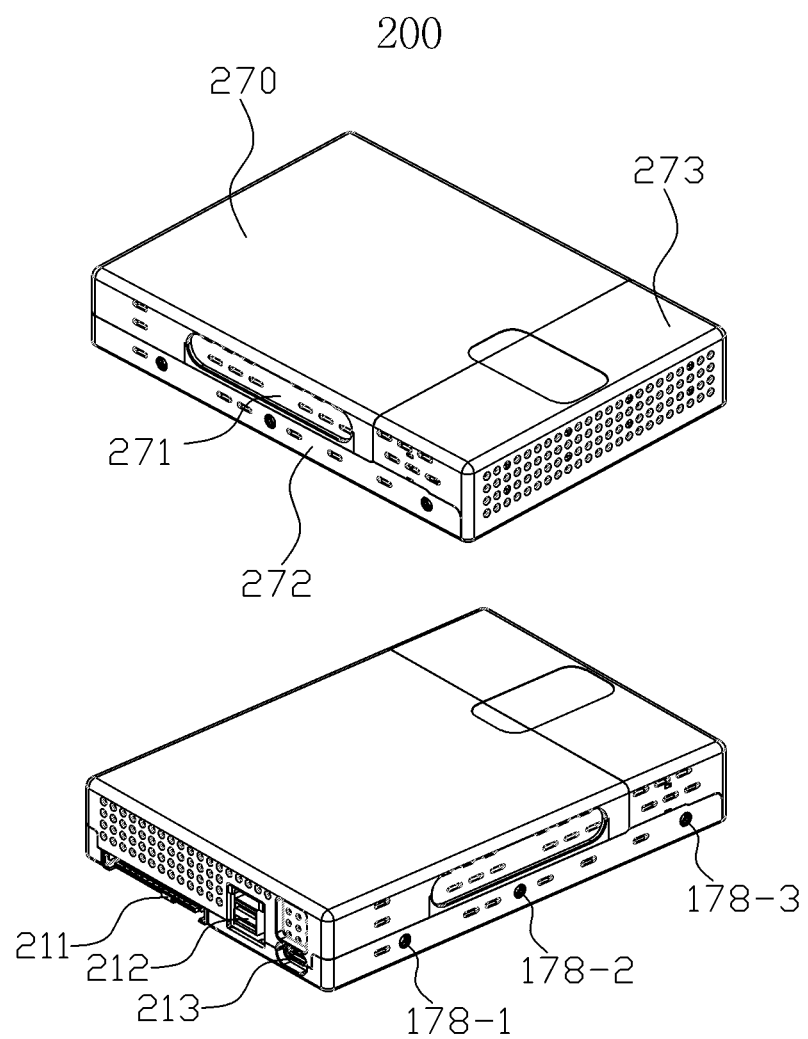
FIG. 8 is a perspective view of an SSD multiplier according to the embodiment of the present invention.

FIG. 8 is a perspective view of the SSD multiplier according to the embodiment of the present invention, and here, an external configuration includes the fixed top cover 270, a bottom cover 272, and a detachable top cover 273, and a side cover 271 may be detachably attached to a left or right side surface of the fixed top cover 270 in a sliding manner or integrally provided with the fixed top cover 270.

The first connector 211 is located in the same position as a connector for interfacing the 3.5-inch hard disk drive, and the second connector 212 for PCIe signal expansion and the third connector 213, to which a USB 3.1 Type-C connector is applied to receive control signals from the connected external computer system (not shown) are provided on a right side of the first connector 211.

In the external configuration, side surface fixing holes 178-1, 178-2, and 178-3 are provided in left/right side surfaces, and bottom surface fixing holes (not shown) are provided on left/right outer sides of the bottom surface.

FIG. 9 is an exploded perspective view of the SSD multiplier according to the embodiment of the present invention, and illustrates a state in which short M.2 SSD memory cards 230-1 are installed on an upper stage, and long M.2 SSD memory cards 230-2 are installed on a lower stage.

The fixed top cover 270 has a certain length so that end portions of the short SSD memory cards 230, 232, and 234, in which fixing grooves 231, 233, and 236 of the short SSD memory cards 230, 232, and 234 are located, can be exposed to the outside when the fixed top cover 270 is coupled to the bottom cover 272, and thus, a user can open the detachable top cover 273 and insert or remove the short SSD memory cards 230, 232, and 234.

Four LED display units 160 are provided on an upper surface of the printed circuit board 201, which is coupled to the inner side of the bottom cover 272, and four LED display units 160 are provided on a lower surface of the printed circuit board 201 in a such a manner that the first LED display unit 161 corresponding to the first SSD memory card 251, which is provided on the upper stage, is provided on the upper surface of the printed circuit board 201.

The short M.2 SSD memory card 230-1 provided on the upper stage is coupled in a sliding manner to the memory card connection connector 241, which is provided on the backplane board 140, along memory card guide upper grooves 264-1 of memory card guide holders 257 disposed at regular intervals between the fixed top cover 270 and the printed circuit board 201.

The memory card guide holder 257 will be described in more detail with reference to FIG. 10.

A force pushing in a direction of the memory card connection connector 241 provided on the backplane board 140 is constantly applied to the short M.2 SSD memory card 230-1 by an elastic structure provided in a short memory card holder 280, and a detailed description thereof will be made in the description of the short memory card holder 280 with reference to FIG. 12.

The fixed top cover 270 is firmly fixed to the bottom cover 272 by coupling fixed top cover fixing protrusions 239, which are respectively provided in the vicinity of four lower corners of the fixed top cover 270, to the bottom cover 272 using a separate fixing means (not shown) such as screws and bolts.

At least one or more uneven guide grooves 235 are provided on an inner wall of each of left/right side surfaces of the fixed top cover 270.

The detachable top cover 273 is coupled to the fixed top cover 270 and the bottom cover 272 using the corresponding fixing means provided at upper and lower ends thereof.

An upper coupling protrusion 274 is provided on a coupling surface of the detachable top cover 273, which is coupled to the fixed top cover 270, at left and right sides of an upper coupling release guide groove 275, and a lower outer coupling protrusion 276 protruding from a lower inner edge portion of a vertical surface of the detachable top cover 273, in which a series of heat dissipation holes are provided, is provided for coupling with the bottom cover 272.

Figure 11:
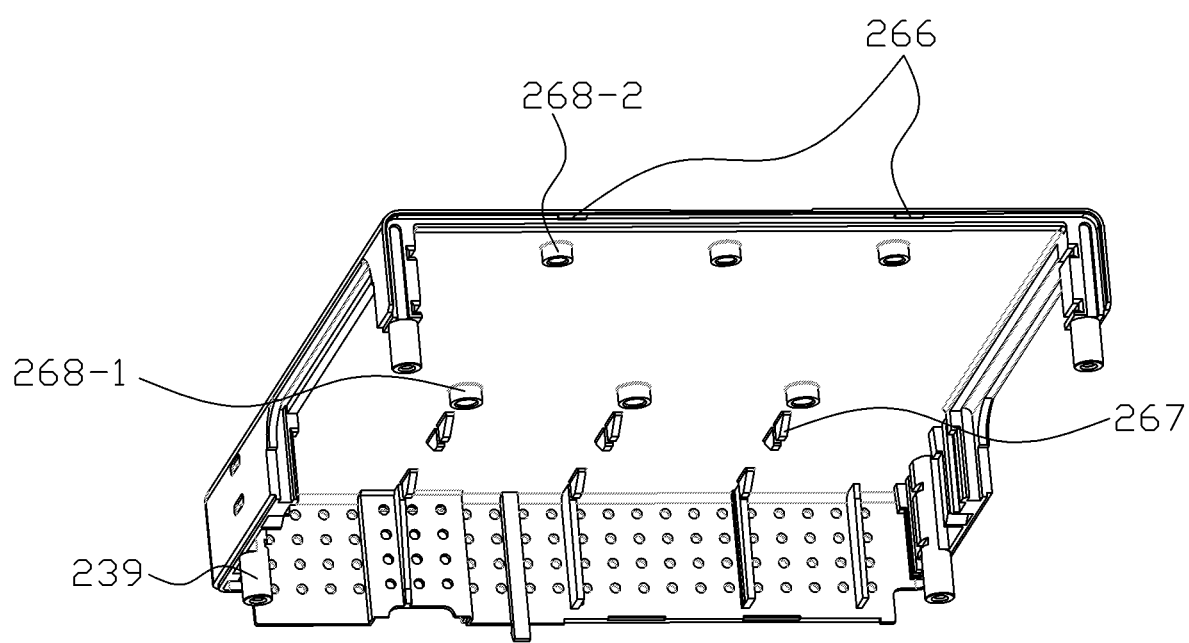
FIG. 11 is a perspective view of a fixed top cover according to the embodiment of the present invention.

In order for the detachable top cover 273 to be coupled to the SSD multiplier 200 of the present invention, the upper coupling protrusion 274 provided at the upper side is fixed in a manner of being caught by an inner protrusion of a fixed top cover lower end coupling protrusion 266 provided in the fixed top cover 270 shown in FIG. 11, and the lower outer coupling protrusion 276 provided at the lower side is fixed in a manner of being caught by a protrusion of a detachable top cover coupling groove 265 provided in the bottom cover 272.

In order for the coupled detachable top cover 273 to be separated from a body of the SSD multiplier 200 of the present invention, when the upper coupling release guide groove 275 surface-down treated in a U-shape at a center of the detachable top cover 273 is pressed, the upper coupling protrusion 274 provided on left/right sides of the upper coupling release guide groove 275 is separated from the fixed top cover lower end coupling protrusion 266 provided on the fixed top cover 270, and at the same time, a downward force is applied to the detachable top cover 272 such that the detachable top cover 273 is pulled out in an X-axis direction, in this manner, the detachable top cover 273 may be separated from the fixed top cover 270 and the bottom cover 272.

Figure 10:
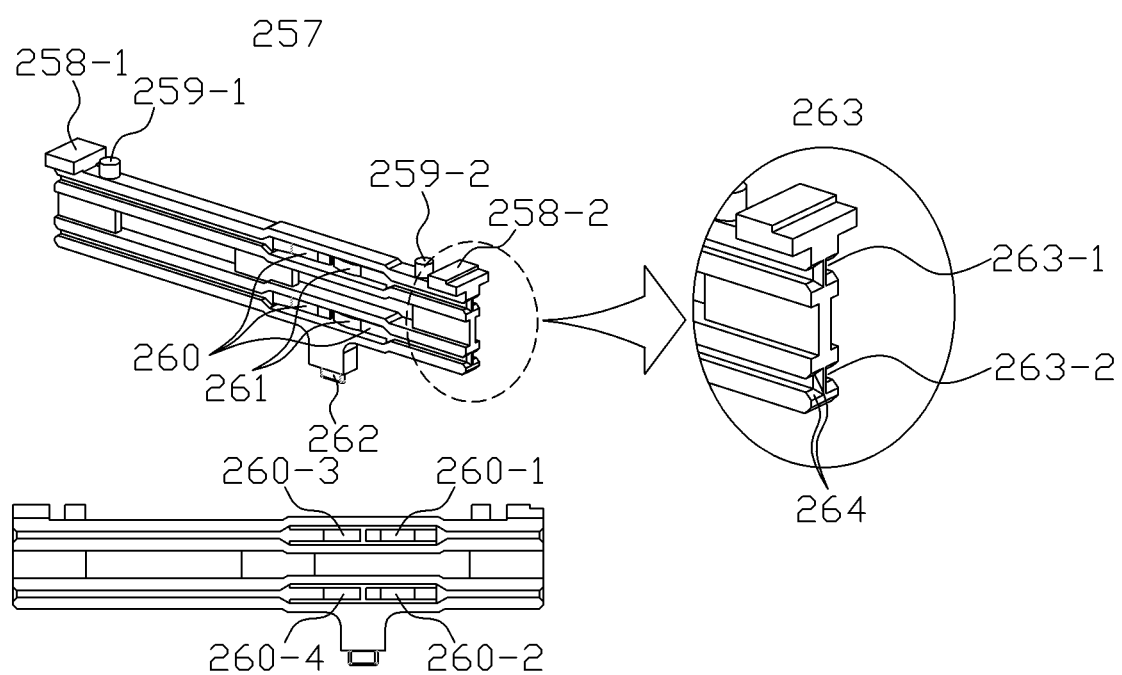
FIG. 10 is a view illustrating a memory card guide holder according to the embodiment of the present invention.

FIG. 10 illustrates the memory card guide holder 257 according to the embodiment of the present invention, and a detailed configuration will be described as follows.

Memory cards used in the memory card guide holder 257 according to the SSD multiplier 200 of the present invention are the M.2 SSD memory cards 230 and the M.3 SSD memory cards 232, and in the case of the full-scale SSD memory card 234, as described above, the memory card guide holder 257 is not used because the full-scale SSD memory card 234 is installed by being guided by at least one or more uneven guide grooves 235 provided inside the left/right side surfaces of the fixed top cover 270.

The memory card guide holder 257 is coupled and fixed to inner/outer memory card guide holder fixing grooves 268-1 and 268-2, which are provided in the fixed top cover 270, and holes (not shown) provided on the printed circuit board 2010 to fix the memory card guide holder 257.

That is, memory card guide holder upper fixing protrusions 259-1 and 259-2, which are provided on an upper end of the memory card guide holder 257, are aligned with the inner/outer memory card guide holder fixing grooves 268-1 and 268-2 of the fixed top cover 270, respectively, and are coupled thereto in a press-fit manner. When the memory card guide holder 257 is coupled to the fixed top cover 270 in the press-fit manner, two horizontal supports 258-1 and 258-2 provided outside the memory card guide holder upper fixing protrusions 259-1 and 259-2 are in close contact with an inner side surface of the fixed top cover 270 to maintain a matched flatness, and accordingly, the memory card guide holder 257 maintains a vertical direction with respect to the fixed top cover 270.

In the state in which the memory card guide holder 257 is coupled to the fixed top cover 270 in such a press-fit manner, even when the inner side surface of the fixed top cover 270 to which the memory card guide holder 257 is coupled faces downward for assembly, the memory card guide holder 257 is maintained in the coupled state. In addition, when the fixed top cover 270 is assembled to the bottom cover 272, in which the printed circuit board 201 is provided, in a Y-axis direction, the fixed top cover fixing protrusions 239 provided at four corners of the lower surface of the fixed top cover 270 are each coupled along a corresponding groove (not shown) provided in the bottom cover 272, and accordingly, a memory card guide holder lower fixing protrusion 262 provided at a lower end of the memory card guide holder 257 is naturally coupled and fixed to a hole (not shown) provided on the printed circuit board 201 to fix the memory card guide holder 257.

In a case in which the SSD multiplier 200 according to the embodiment of the present invention of FIG. 9 is configured with the M.2 SSD memory cards 230, three memory card guide holders 257 are provided. The M.2 SSD memory card 230, which is to be guided along a memory card guide groove 263, is guided while pushing a side surface holder semicircular protrusion 261 provided at an end portion of a memory card side holder 260 outward, and is coupled to a corresponding one of the memory card connection connectors 241 to 243 provided on the backplane board 140. In this case, the memory card side holder 260, which is pushed outward, pushes the M.2 SSD memory card 230 by an elastic force of the plastic toward a center line in a direction in which the memory card is inserted.

MODES OF THE INVENTION

As another application example, a case of the memory card guide holders 257, which are provided on left/right sides of the M.2 SSD memory card 230 inserted through a second row of the upper stage, will be described as follows.

In this case, the memory card guide holders 257 are provided on the left/right sides of the M.2 SSD memory card 230, and a wide entrance is secured due to a memory card entrance guide inclined surface 264 provided at an inlet of the memory card guide groove 263, so that the M.2 SSD memory card 230 is guided more easily into one of memory card guide grooves 263-1 provided in left/right upper ends of the memory card guide holder 257. When the M.2 SSD memory card 230 passes through a memory card left side holder 260-1 and a memory card right-side holder 260-2, the memory card left side holder 260-1 pushes a side holder semicircular holder 261 provided at an end thereof outward. Accordingly, the memory card receives a force that pushes to the right according to an elastic force of the memory card left side holder 260-1, and the memory card right-side holder 260-2 pushes a side holder semicircular holder 261 provided at an end thereof outward, and accordingly, the memory card also receives a force that pushes to the left according to an elastic force of the memory card right-side holder 260-2. Thus, the M.2 SSD memory card 230 is inserted into a corresponding one among the memory card connection connectors 241 to 243, which is provided on the backplane board 140, along the left/right side memory card upper guide grooves 263-1.

Accordingly, the M.2 SSD memory card 230 inserted into the second row of the upper stage is not only accurately guided to one of the memory card connection connectors 241 to 243 by the memory card guide holder 257 provided on the left/right sides, but also receives the force that constantly pushes along a center line in the insertion direction by the elastic force of the memory card side holders 260-1 and 260-3 provided in the left/right memory card guide holders 257.

This feature may allow the memory card not to come out downward even when the SSD multiplier 200 of the present invention has the fixing groove 231 of the M.2 SSD memory card 230 facing downward in a vertical direction when the inserted M.2 SSD memory card 230 is inserted only into the memory card side holder 260 provided in the memory card guide holder 257 although the inserted M.2 SSD memory card 230 is not inserted into the memory card connection connectors 241 to 243, so that the M.2 SSD memory card 230 may be installed through the memory card guide holder 257 without depending on the orientation of the SSD multiplier 200 even when the detachable top cover 272 is open in the SSD multiplier 200 of the present invention.

In the above, the M.2 SSD memory card has been described as an example with reference to FIG. 9, and the contents thereof may be equally applied to the M.3 SSD memory card 232 of FIG. 16, and in the case of the full-scale SSD memory card 234 of FIG. 17, it is possible to derive the same effect by additionally providing the memory card side holder 260 on each of inner surfaces of the left/right side covers 271.

Meanwhile, an integral-type side cover 271 in which the memory card side holders 260 facing inward are provided on left/right side portions of the fixed top cover 270 may also be considered.

FIG. 11 is a perspective view of the fixed top cover according to the embodiment of the present invention and illustrates an internal structure of the fixed top cover.

The memory card guide holder upper fixing protrusion 259-1 located at the inner side of the memory card guide holder 257 described above is coupled to the inner memory card guide holder fixing groove 268-1 provided at the inner side of the fixed top cover 270, and the memory card guide holder upper fixing protrusion 259-2 located at the outer side of the memory card guide holder 257 is fixed to the outer memory card guide holder fixing groove 268-2 provided at the inner side of the fixed top cover 270 in a press-fit manner.

The fixed top cover fixing protrusions 239 protruding from each of the four inside corners provided in the fixed top cover 270 are coupled and fixed to corresponding grooves (not shown) of the bottom cover 272. Accordingly, the backplane board 140 inserted into the backplane board connection connector (not shown), which is provided on the printed circuit board 201 provided in the bottom cover 272, is coupled and fixed to uneven grooves formed by a series of backplane board fixing protrusions 267.

Figure 12:
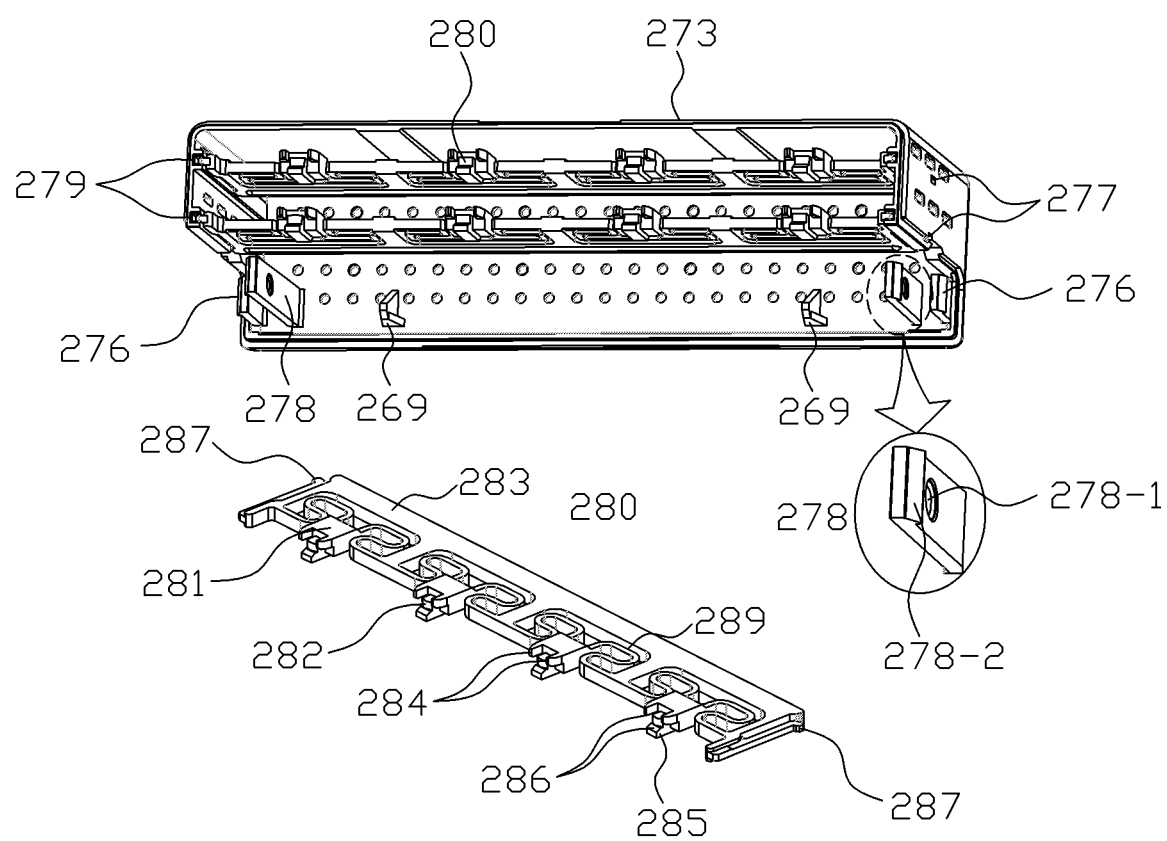
FIG. 12 is a perspective view of a short memory card holder and a detachable top cover to which the short memory card holder is coupled according to the embodiment of the present invention.

FIG. 12 is a perspective view of the short memory card holder 280 and the detachable top cover 273 to which the short memory card holder 280 is coupled according to the embodiment of the present invention, and a detailed configuration thereof will be described as follows.

In the detachable top cover 273 shown in the upper side of FIG. 12, the short memory card holders 280 are installed in two stages with upper and lower stages.

The lower outer coupling protrusion 276 is provided at each of lower left/right sides of a lower portion of the detachable top cover 273 so that the detachable top cover 273 is coupled to the bottom cover 272, and a lower inner coupling protrusion 278 is provided at a position adjacent to and inward of the bottom cover 272.

The structure of the short memory card holder 280 is illustrated at the lower side of FIG. 12.

The lower outer coupling protrusions 276 provided on the left/right sides are slidably inserted into the detachable top cover coupling grooves 265 provided in the bottom cover 272, and accordingly, coupled to the detachable top cover coupling grooves 265 while protrusions of end portions of the lower outer coupling protrusions 276 are caught on protrusions provided in the detachable top cover coupling grooves 265.

The end portion of the lower outer coupling protrusion 276 has an inclination angle and a coupling force is formed by an elastic force according to the inclination angle and the thickness of the lower outer coupling protrusion 276.

The lower inner coupling protrusion 278 may be provided with a lower inner coupling protrusion fastening hole 278-1, whose center line matches that of the side surface fixing hole 178-3 provided in the bottom cover 272, and may be semi-permanently fixed from the outside of the bottom cover 272 using a separate fixing means (not shown) such as screw bolts or may not be fixed.

A coupling lower inner fixing protrusion 278-2 at the end portion of the lower inner coupling protrusion 278 is fixed to a protrusion forming a nut groove edge of the bottom cover, which surrounds a square nut 183 provided to correspond to the side surface fixing hole 178-3, so that a more robust coupling structure is formed, and thus a separate fixing means such as the screw bolts described above is not used unless semi-permanent coupling is required.

In the state in which the detachable top cover 273 is coupled to the fixed top cover 270 and the bottom cover 272, a detachable top cover pressing prevention protrusion 269 is in surface contact with an upper end of the printed circuit board 201 to prevent the detachable top cover 273 from being pressed in a downward direction, which serves to prevent the coupled state from being affected in the downward direction.

A detailed structure of the short memory card holder 280 illustrated in the lower side of FIG. 12 will be described as follows.

A memory card close contact head 281 includes a memory card close contact semicircular protrusion 282 configured to prevent the SSD memory cards 230, 232, and 234 from being separated in a left-right horizontal direction by coming into surface contact with the fixing grooves 231, 233, and 236 of the SSD memory card, a memory card upward separation prevention protrusion 284 and a memory card downward separation prevention protrusion 285 that are configured to prevent the fixing grooves 231, 233, and 236 of the SSD memory cards 230, 232, and 234, which are in surface contact, from being separated in the vertical direction (Y-axis direction), and an inclined surface 286 configured to guide the SSD memory cards 230, 232, and 234 more stably to allow the surface contact to be made.

The memory card close contact head 281 is connected to a short memory card holder cross bar 283 through a left/right S-shaped holder integrated leaf spring 289 formed by branching from a body of the short memory card holder cross bar 283.

When the short memory card holder 280 corresponds to the M.2 SSD memory card 230, the short memory card holder 280 includes four memory card close contact heads 281, and when the short memory card holder 280 corresponds to the M.3 SSD memory card 232 or the full-scale SSD memory card 234, the short memory card holder 280 includes three memory card close contact heads 281.

Short memory card holder fixing protrusions 287 are provided at left/right ends of the short memory card holder 280, and are guided along short memory card holder guide grooves 279 of the detachable top cover 273 to be coupled to short memory card holder fixing grooves 277, so that the short memory card holder 280 is fixed to the detachable top cover 273.

Figure 13:
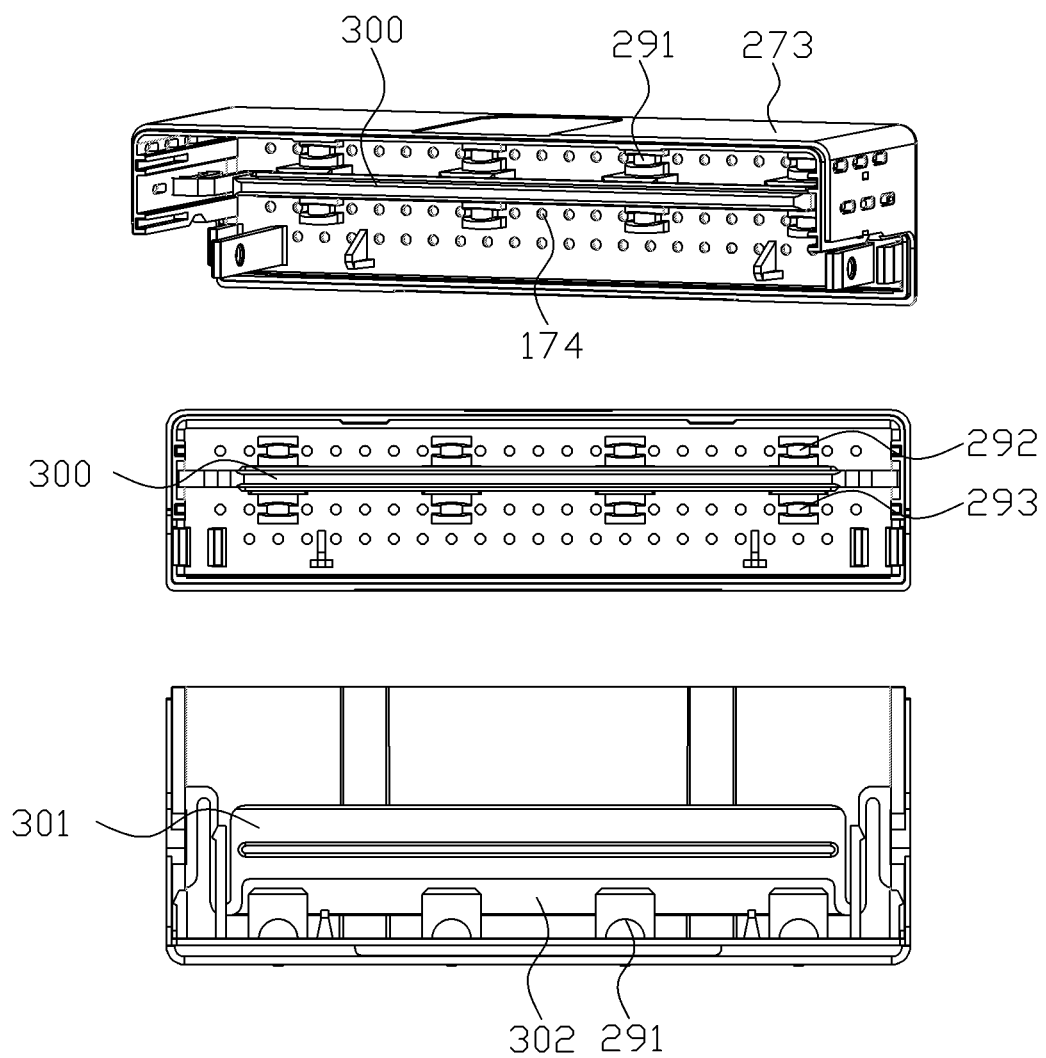
FIG. 13 is a set of a rear view, a front view, and a perspective view of a long memory card holder and the detachable top cover to which the long memory card holder is coupled according to the embodiment of the present invention.

FIG. 13 is a set of a rear view, a front view, and a perspective view of the long memory card holder 291 and the detachable top cover 293, to which the long memory card holder 291 is coupled, according to the embodiment of the present invention, and a detailed configuration thereof will be described with reference to the drawing as follows.

The long memory card holder 291 includes a compression spring (not shown) therein, and unlike the case of the short memory card holder 280, the long memory card holder 291 is independent of the SSD memory cards 230, 232, and 234, and thus is positioned by being inserted into heat dissipation holes 174 arranged in the inner surface of the detachable top cover 273 after being aligned with the position of each of the fixing grooves 231, 233, and 236 of the SSD memory cards 230, 232, and 234. A long memory card holder support separation prevention guide 302 of a long memory card holder support 300 is inserted into a long memory card holder support guide groove 298 provided in a center of the long memory card holder 291 to fix the long memory card holders 291 arranged at regular intervals.

Figure 14:
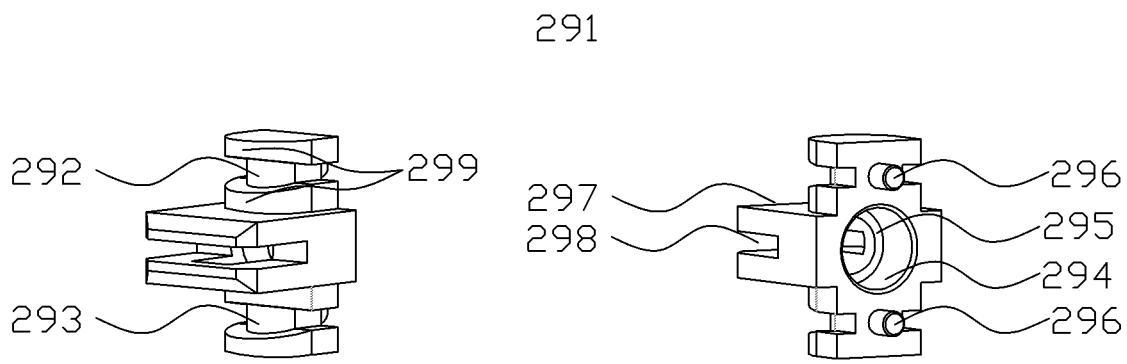
FIG. 14 is a perspective view of a front surface and a rear surface of the long memory card holder according to the embodiment of the present invention for three-dimensionally illustrating the shape of the long memory card holder.

FIG. 14 is a perspective view of a front surface and a rear surface of the long memory card holder 291 according to the embodiment of the present invention for three-dimensionally illustrating the shape of the long memory card holder 291, and a detailed configuration thereof will be described in detail as follows.

An upper memory card close contact semicircular protrusion 292 and a lower memory card close contact semicircular protrusion 293 are in surface contact with each of the fixing grooves 231, 233, and 236 of the SSD memory cards 230, 232, and 234, and the memory cards 230, 232, and 234 in surface contact with the upper/lower memory card close contact semicircular protrusions 292 and 293 are prevented from being separated due to a long memory card upward/downward separation prevention protrusion 299.

The long memory card upward/downward separation prevention protrusion 299 forms an inclined surface at a portion at which the upper memory card close contact semicircular protrusion 292 meets the lower memory card close contact semicircular protrusion 293 and thus serves to guide the SSD memory cards 230, 232, and 234 more smoothly.

Long memory card holder support guide protrusions 297 are respectively formed above and below the long memory card holder support guide groove 298 located in the center of the front surface of the long memory card holder 291, and the long memory card holder support separation prevention guide 302 of the long memory card holder support 300 is inserted into the long memory card holder support guide groove 298 in a sliding manner with an appropriate tolerance.

That is, a vertical width of the long memory card holder support guide groove 298 is slightly greater than that of the long memory card holder support separation prevention guide 302.

A compression spring inlet 294 is provided with a compression spring (not shown) whose elastic force is not too high. An end of the inserted compression spring (not shown) is in contact with a compression spring locking protrusion 294, and an opposite end thereof protrudes slightly out of a flat surface of the rear surface of the long memory card holder 291.

Long memory card holder circular protrusions 296 provided on upper/lower sides of the rear surface of the long memory card holder 291 are aligned with the position, at which the memory card holder support 300 is allowed to be coupled to the detachable top cover 273, and are inserted into the vent holes 174 with a certain margin maintained.

Here, an outer diameter of the long memory card holder circular protrusion 296 is designed to be smaller than an inner diameter of the vent hole 174, so that the long memory card holder circular protrusions 296 are not fixed by the vent holes 174 and maintained in a state of being repelled from the inner surface of the detachable top cover 273 by the compression spring (not shown).

Figure 15:
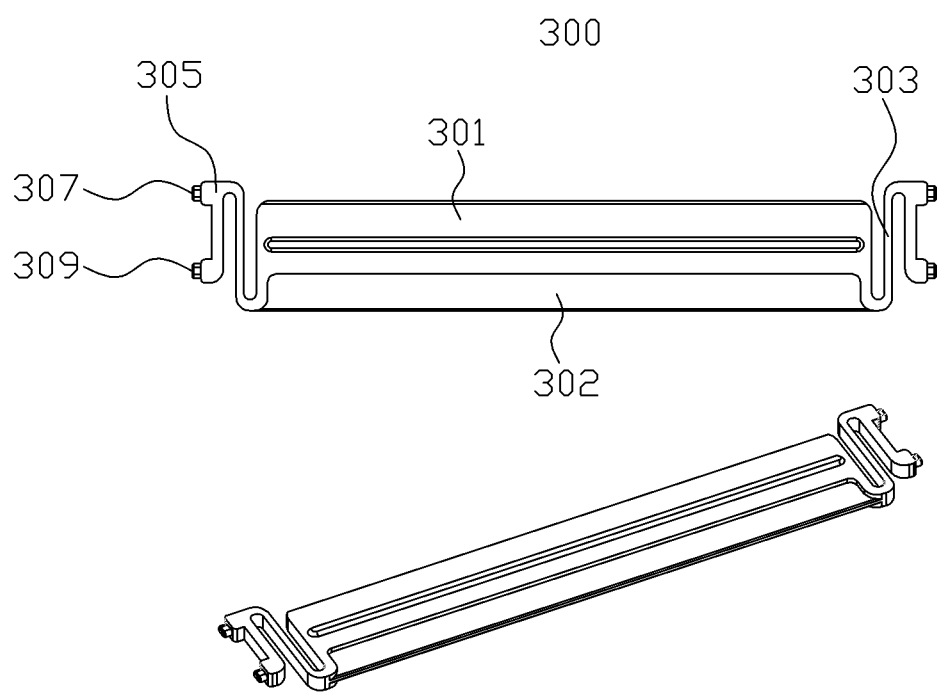
FIG. 15 is a set of a plan view and a perspective view of a long memory card holder support according to the embodiment of the present invention.

FIG. 15 is a set of a plan view and a perspective view of the long memory card holder support 300 according to the embodiment of the present invention, and the main components will be described in detail as follows.

The long memory card holder support 300 includes a long memory card holder support cross bar 301 corresponding to a body thereof, the long memory card holder support separation prevention guide 302, and long memory card holder support fixing parts 305 provided on the left/right sides of the long memory card holder support separation prevention guide 302.

The long memory card holder support separation prevention guide 302 is inserted into the long memory card holder support guide groove 298 provided in the long memory card holder 291 and serves to prevent the long memory card holder 291 from being separated while being guided in a front-rear direction (X-axis direction) along the long memory card holder support separation prevention guide 302.

The long memory card holder support fixing parts 305 are connected to long memory card holder support elastic plates 303 connected to the long memory card holder support cross bar 301 and the long memory card holder support separation prevention guide 302, and thus may be stretched and contracted in the horizontal direction and have a restoring force.

Long memory card holder support fixing protrusions 307 and 309 provided on front/rear side ends of the long memory card holder support fixing parts 305 are inserted into rectangular vent holes provided in left/right side surfaces of the detachable top cover, and are fixed by the elastic force of the long memory card holder support elastic plate 303 of the long memory card holder support.

When long SSD memory cards 230, 232, and 234 are mounted in a state in which the combined structure of the long memory card holder 291 and the long memory card holder support 300 is provided inside the detachable top cover 273, the fixing grooves 231, 233, and 236 of the installed SSD memory cards 230, 232, and 234 are in surface contact with the upper memory card close contact semicircular protrusion 292 and the lower memory card close contact semicircular protrusion 293 of the long memory card holder 291 in the operation of fitting the detachable top cover 273 to the fixed top cover 270 and the bottom cover 272. In addition, in the process in which the detachable top cover 273 is completely fitted and fixed to the fixed top cover 270 and the bottom cover 272, the fixing grooves 231, 233, and 236 of the installed SSD memory cards 230, 232, and 234 push the upper memory card close contact semicircular protrusion 292 and the lower memory card close contact semicircular protrusion 293, which are in surface contact with the fixing groove 231, 233, or 236, outward in the X-axis direction until the detachable top cover 273 is completely closed while the long memory card holder 291 is being pushed toward the backplane board 140 in the X-direction by the elastic force of the compression spring (not shown) provided inside the long memory card holder 291.

In addition, the SSD memory card 230, 232, or 234, which is sandwiched between the inclined surfaces of the long memory card upward/downward separation prevention protrusion 299 of the long memory card holder 291, is fixed with respect to the vertical direction (Y-axis direction) by the elastic force of the compression spring (not shown) and thus is prevented from being separated.

In the above, in order to protect the long SSD memory cards 230, 232, and 234 from external vibrations, the memory card support structure with the detachable structure in which the long memory card holder 291 and the long memory card holder support 300 of FIG. 14 are coupled to each other is presented, but it is also possible to integrate the basic operation principle of the memory card side holder 260 and the side surface holder semicircular protrusion 261, which is provided on the end surface of the memory card side holder 260, of FIG. 10 on the vertical surface of the detachable top cover.

However, in this case, since the SSD multiplier 200 of the present invention has basically the same form factor as a 3.5-inch hard disk drive, when the M.2 SSD memory cards 230 or the M.3 SSD memory cards 232 are horizontally arranged and inserted into the SSD multiplier 200, the number of inserted SSD memory cards 230 and the number of inserted SSD memory cards 232 are not the same, and accordingly, the positions of the fixing grooves 231 and 233 are also changed. Thus, the detachable top cover 273 should be provided in two types, one for the M.2 SSD memory card 230 and one for the M.3 SSD memory card 232.

Here, the full-scale SSD memory card 234 includes fixing grooves 236-1, 236-2, and 236-3, which are dedicated to the full-scale SSD memory card 234 and are provided according to the positions of the fixing grooves 233 in a case in which the M.2 SSD memory cards 232 are arranged in three rows, and thus may use the detachable top cover 273 provided for the M.3 SSD memory card 232 in common.

FIG. 16 is a perspective view of an SSD multiplier 400 according to an embodiment of the present invention, in which the M.3 SSD memory cards 232 are arranged in three horizontal arrays and three vertical stages in a state in which the fixed top cover 270 and the detachable top cover 273 are open.

The SSD multiplier 400 may significantly increase the memory capacity compared to a case in which the M.2 SSD memory cards 230 illustrated in FIG. 9 are arranged in four horizontal arrays and two vertical stages.

That is, the M.3 SSD memory card has a structure in which unit memory devices are arranged in two arrays as compared to the M.2 SSD memory card 230 and thus has a capacity per unit SSD memory card that is twice the capacity per M.2 SSD memory card 230.

For example, in a case in which a capacity of the unit M.2 SSD memory card 230 is 1 TByte, the SSD multiplier 400 based on the M.3 SSD memory card 232, which is illustrated in FIG. 16, supports a capacity of 18 TBytes since nine M.3 SSD memory cards are provided while the SSD multiplier 200 based on the M.2 SSD memory card, which is illustrated in FIG. 9, supports a capacity of 8 TBytes.

According to the specification of the M.3 SSD memory card 230, the capacity of the unit M.3 SSD memory card 230 is a maximum of 16 TBytes, and thus the SSD multiplier 400 of the present invention may support a maximum capacity of 144 TBytes.

As described above, in the SSD multiplier 400 based on the M.3 SSD memory cards 232, it is preferable that a transmission bandwidth is expanded in terms of interfacing since the supported capacity is significantly increased. To this end, in the SSD multiplier 400 of the present invention, for the purpose of expanding a PCIe bus lane, the second connector 212 such as an OCULINK or SFF-8643 connector is additionally provided to connect to the controller 217.

Meanwhile, when a large number of interface lanes are used for the edge finger portion 246 of the unit SSD memory cards 230, 232, or 234, in the SSD multipliers 200, 400, and 500 of the present invention, SSD memory cards 232-11, 232-12, and 232-13 arranged at a top stage may not be provided, but only SSD memory card 232-21, 232-22, 232-23, 232-31, 232-32, and 232-33 arranged at lower stages may be provided and used.

In this case, an LED light guide plate (not shown) made of a transparent acrylic material may be provided at a point, from which the SSD memory cards 232-11, 232-12, and 232-13 were removed, in a structure in which an inside thereof is caught on the vertical surface of the memory card guide holder 257 and does not come out to the outside, and may be utilized as the LED display unit 160 for the SSD memory cards 232-21, 232-22, and 232-23 provided below the SSD memory cards 232-11, 232-12, and 232-13. For the SSD memory cards 232-31, 232-32, and 232-33 located at the bottom stage, the LED display unit 290 provided on the upper surface of the printed circuit board 201 may be utilized.

FIG. 17 is a perspective view of an SSD multiplier 500 according to an embodiment of the present invention, in which the full-scale SSD memory cards 234 are arranged in three vertical stages in a state in which the fixed top cover 270 and the detachable top cover 273 are open, and detailed features thereof will be described as follows.

Looking at only the overall shape, the SSD multiplier 500 looks similar to the SSD multiplier 400 illustrated in FIG. 16 to which the M.3 SSD memory card 232s are applied. Since one full-scale SSD memory card 234 is mounted in place of the M.3 SSD memory cards 234 arranged in three arrays, in the SSD multiplier 500 to which the full-scale SSD memory card 234 of the present invention is applied, a total of six memory controllers 240-3 and six memory card connection connectors 241 or 243 may be saved as compared with the SSD multiplier based on the M.3 SSD memory card 234, which is illustrated in FIG. 16, because only one memory controller 240-3 for a full-scale SSD and one memory card connection connector 242 are used for one SSD memory card 234.

Further, since cut surfaces of the left/right sides of the M.3 SSD memory card 234 may be used as a wiring space of the printed circuit board 201 in addition to the fact that two memory card guide holders 257 are also not used, the number of layers constituting the printed circuit board 201 may be reduced, and thus it is possible to provide a SSD multiplier 500 with more cost competitiveness while supporting the same memory capacity as the SSD multiplier 400 based on the M.3 SSD memory card 232.

Although the preferred embodiments of the present invention have been described in detail, those skilled in the art will appreciate that various modifications, additions, and substitutions are possible, without departing from the scope of the appended claims.

INDUSTRIAL APPLICABILITY

The present invention provides a high-capacity solid-state drive (SSD) that has the same form factor as 3.5-inch hard disk drives and has a structure in which memory cards, such as standard M.2 SSDs, standard M.3 SSDs or nonstandard full-scale SSDs, are inserted in a horizontal sliding manner into an exterior having the same size as the 3.5-inch hard disk drive, and are provided in a multi-stage arrangement in a vertical direction.

The invention claimed is:

1. A solid-state drive (SSD) multiplier comprising:
   a printed circuit board including an interface connection means for peripheral component interconnect express (PCIe), non-volatile memory express (NVMe), or serial advanced technology attachment (SATA);
   at least one or more non-volatile memory cards that support a PCIe, NVMe, or SATA interface method;
   a bottom cover on which the printed circuit board is mounted and fixed;
   a fixed top cover that is coupled corresponding to the bottom cover and has a shape in which a portion corresponding to an opposite side of the interface connection means is open;
   a detachable top cover coupled to the open portion of the fixed top cover and the bottom cover;
   a control unit connected to the interface connection means for PCIe, NVMe, or SATA;
   a backplane board fixedly disposed in a vertical direction with respect to the printed circuit board; and
   memory card connection connectors which are disposed on one side surface of the backplane board and to which the at least one or more non-volatile memory cards are connected,
   wherein, when the memory card is connected to the memory card connection connector, and the detachable top cover is coupled to the fixed top cover and the bottom cover, a force constantly pushing the memory card toward the memory card connection connector is applied by an elastic body of a memory card holder provided inside the detachable top cover, and accordingly, the memory card connected to the memory card connection connector remains in close contact with the memory card connection connector.

2. The SSD multiplier of claim 1, wherein
   the printed circuit board includes at least one or more lower backplane board connectors at a lower end portion where the backplane board is located, and
   the lower backplane board connector makes a circuit connection between the backplane board and the control unit.

3. The SSD multiplier of claim 1, wherein, when the memory card is a short memory card and is connected to the memory card connection connector, the fixed top cover allows an end portion of the short memory card to be exposed to the outside, so that the short memory card is easily removed or inserted when the detachable top cover is removed.

4. The SSD multiplier of claim 1, wherein the detachable top cover includes a short memory card holder corresponding to a short memory card when the memory card is the short memory card and is connected to the memory card connection connector, and includes a long memory card holder corresponding to a long memory card when the memory card is the long memory card and is connected to the memory card connection connector.

5. The SSD multiplier of claim 4, wherein
the short memory card holder includes a memory card close contact semicircular protrusion that is in accurate close contact with a semicircular fixing groove provided on the short memory card, a memory card upward/downward separation prevention protrusion for accurately guiding the short memory card to the memory card close contact semicircular protrusion, a holder integrated leaf spring having a central portion on which the memory card close contact semicircular protrusion and the memory card upward/downward separation prevention protrusion are formed, a short memory card holder cross bar from which the leaf spring branches, short memory card holder fixing protrusions provided at left and right ends of the short memory card holder cross bar, and
a force constantly pushing the short memory card toward the memory card connection connector is applied by the elasticity of the holder integrated leaf spring.

6. The SSD multiplier of claim 5, wherein the memory card upward/downward separation prevention protrusion includes an inclined surface at each of upper and lower sides thereof, so that the semicircular fixing groove of the short memory card is accurately guided to the memory card close contact semicircular protrusion.

7. The SSD multiplier of claim 5, wherein the short memory card holder fixing protrusions of the side surfaces of the detachable top cover are coupled to the detachable top cover through short memory card holder fixing grooves and short memory card holder guide grooves that are provided in the detachable top cover, so that the short memory card holder is fixed to the detachable top cover.

8. The SSD multiplier of claim 4, wherein the long memory card holder includes an upper memory card close contact semicircular protrusion and a lower memory card close contact semicircular protrusion that are in accurate close contact with a semicircular fixing groove provided in the long memory card, long memory card upward/downward separation prevention protrusions for accurately guiding the long memory card to the memory card close contact semicircular protrusion, a compression spring inlet provided in a form of an opening hole in the long memory card holder in an opposite direction of the memory card close contact semicircular protrusion, a compression spring locking protrusion, a compression spring provided inside the compression spring inlet, upper and lower long memory card holder circular protrusions inserted into corresponding holes provided in the detachable top cover, and
a long memory card holder support guide groove into which a long memory card holder support is inserted so that a series of long memory card holders are supported so as not to be separated.

9. The SSD multiplier of claim 8, wherein the memory card upward/downward separation prevention protrusion includes an inclined surface at each of upper and lower sides thereof, so that the semicircular fixing groove of the long memory card is accurately guided to the long memory card close contact semicircular protrusion by the upward/downward separation prevention protrusion.

10. The SSD multiplier of claim 8, wherein due to loose coupling of a long memory card holder support separation prevention guide of a long memory card holder support cross bar and the long memory card holder support guide groove of the long memory card holder, loose coupling of the long memory card holder circular protrusions and guide holes of the detachable top cover, and an elastic force of the compression spring inserted into the compression spring inlet and provided between the compression spring locking protrusion of the long memory card holder and the detachable top cover, the long memory card holder is repelled from an inner side surface of the detachable top cover without being separated along the long memory card holder support separation prevention guide, so that when the detachable top cover is coupled to the fixed top cover and the bottom cover, the force that constantly pushes the memory card toward the memory card connection connector is applied.

11. The SSD multiplier of claim 4, wherein the long memory card holder is provided at an inner side of a vertical surface of the detachable top cover and is integrated therewith.

12. The SSD multiplier of claim 1, comprising:
memory card guide holders disposed vertically at equal intervals between the fixed top cover and the printed circuit board; and
memory card guide grooves provided at side surfaces of the memory card guide holder,
wherein the memory card is guided along the memory card guide grooves and connected to the memory card connection connector.

13. The SSD multiplier of claim 12, wherein
each of the memory card guide holders includes a memory card side holder provided on an inner side thereof along the memory card guide groove in a direction parallel to the memory card guide groove and a semicircular protrusion provided at an end portion of the memory card side holder, and
the memory card is supported by the elasticity of the memory card side holder generated when a side surface of the memory card presses the side holder semicircular protrusion provided at the end portion of the memory card side holder in a process in which the memory card is guided along the memory card guide groove and connected to the memory card connection connector.

14. The SSD multiplier of claim 13, wherein in order for the memory card to be smoothly inserted into the memory card guide groove from a direction opposite to the memory card connection connector, the memory card guide holder includes a guide inclined surface at the entrance of the memory card guide groove so that the memory card is allowed to be inserted more easily.

15. The SSD multiplier of claim 13, wherein the memory card guide holder additionally includes a horizontal support at an upper end thereof, and the horizontal support of the memory card guide holder is in surface contact with the lower surface of the fixed top cover, so that the memory card guide holder maintains a more stable vertical state with respect to the fixed top cover.

16. The SSD multiplier of claim 12, wherein a memory card guide holder upper fixing protrusion of the memory card guide holder is coupled to a memory card guide holder fixing groove provided on a lower surface of the fixed top cover, so that the memory card guide holder is fixed to the fixed top cover.

17. The SSD multiplier of claim 1, wherein in order for the detachable top cover to be reliably coupled to the fixed top cover and the bottom cover and prevented from being unintentionally separated therefrom, a detachable top cover upper coupling protrusion, which overlaps the fixed top cover when the detachable top cover is coupled, is provided on an upper surface of the detachable top cover, and in order for the detachable top cover to be coupled to the bottom cover, a detachable top cover lower outer coupling protrusion protruding from a lower inner edge portion of a vertical surface of the detachable top cover is provided, so that the detachable top cover is coupled to the bottom cover.

18. The SSD multiplier of claim 17, wherein in order to induce the release of the coupling of the detachable top cover upper coupling protrusion coupled to the fixed top cover, the detachable top cover includes an upper coupling release guide groove, which is surface-down treated in a U-shape, as an indication to press a center portion of the upper surface of the detachable top cover.

19. The SSD multiplier of claim 1, wherein in order for the detachable top cover to be coupled to the bottom cover,
the detachable top cover includes a lower inner coupling protrusion protruding from an inner portion of each of left and right corners at a lower inner surface of the vertical surface of the detachable top cover, and
a lower inner coupling protrusion fastening hole and a coupling hole of the bottom cover, which is adjacent to the lower inner coupling protrusion fastening hole, are fixed using a separate fastening means in a state in which the detachable top cover is coupled to the fixed top cover and the bottom cover.

20. The SSD multiplier of claim 19, wherein in order for the detachable top cover to be coupled to the bottom cover,
the detachable top cover includes the lower inner coupling protrusion protruding from the inner portion of each of the left and right corners at the lower inner surface of the vertical surface of the detachable top cover, and
the lower inner coupling protrusion is coupled to a corresponding groove of the bottom cover in a state in which the detachable top cover is coupled to the fixed top cover and the bottom cover.

21. The SSD multiplier of claim 1, wherein the memory card is an M.2 SSD memory card, an M.3 SSD memory card, or a full-scale SSD memory card.

22. The SSD multiplier of claim 21, wherein the full-scale memory card includes at least one or more semicircular memory card fixing grooves in an end surface thereof at an opposite side of an edge finger portion that is coupled to the memory card connection connector.

23. The SSD multiplier of claim 21, wherein the full-scale memory card includes at least one or more light-emitting diodes (LEDs) indicating various operating states in the vicinity of the end surface thereof at the opposite side of the edge finger portion that is coupled to the memory card connection connector.

24. The SSD multiplier of claim 21, wherein the full-scale memory card includes at least one or more semicircular memory card fixing grooves in an end surface thereof at an opposite side of an edge finger portion that is coupled to the memory card connection connector.

25. The SSD multiplier of claim 1, wherein the fixed top cover further includes side covers, which have a detachably attached structure, on left and right side surfaces thereof.

26. The SSD multiplier of claim 25, wherein a memory card side holder facing inward is formed on each of the side covers.

27. The SSD multiplier of claim 1, wherein memory card side holders facing inward are formed on left and right side surfaces of the fixed top cover.

28. The SSD multiplier of claim 1, wherein at least one or more memory card connection connectors are arranged horizontally and vertically on the backplane board so that the memory cards are coupled in a horizontal arrangement and a multi-stage stacking method.

29. The SSD multiplier of claim 28, wherein in the memory card connection connectors arranged on the backplane board,
the memory cards disposed on an upper stage are replaced with an LED light guide plate, and
the LED light guide plate is utilized as an LED display unit for the memory cards provided at a lower stage.

30. The SSD multiplier of claim 1, wherein the interface connection means for PCIe, NVMe, or SATA is physically separated into a first connector and a second connector and connected to the control unit.

31. The SSD multiplier of claim 1, comprising:
a third connector configured to perform universal serial bus (USB) interfacing with the outside;
a bus converter connected to the third connector to convert a USB interface signal;
a second controller connected to the bus converter; and
an LED display unit operated by an output signal of the second controller to display operation state information.

32. The SSD multiplier of claim 1, wherein
the control unit includes:
a first controller configured as a redundant array of independent disks (RAID) controller;
a fault LED signal output from the control unit;
a second controller to which the fault LED signal is connected;
a bus converter connected to the second controller; and
a third connector connected to an output signal converted by the bus converter to perform USB interfacing with the outside.

33. The SSD multiplier of claim 1, wherein the control unit supports a RAID function for the memory cards coupled to a first vertical connection board, so that the memory cards are converted into at least one or more logical storage devices according to a user's designation.

34. The SSD multiplier of claim 1, wherein the control unit is configured as a PCIe switch, is connected in a PCIe x1, x2, or x4 lane configuration to correspond to each of the memory cards, and is connected to the interface connection means for PCIe through a PCIe x2, x4, or x8 interface.

\* \* \* \* \*